(12) United States Patent
Chen et al.

(10) Patent No.: US 7,792,237 B2
(45) Date of Patent: Sep. 7, 2010

(54) SHIFT REGISTER

(75) Inventors: Chung-chun Chen, Hsin-Chu (TW);
Hung-yu Chiou, Hsin-Chu (TW);
Cheng-chiu Pai, Hsin-Chu (TW)

(73) Assignee: AU Optronics Corp., Hsin-Chu (TW)

( * ) Notice: Subject to any disclaimer, the term of this patent is extended or adjusted under 35 U.S.C. 154(b) by 0 days.

(21) Appl. No.: 12/267,053

(22) Filed: Nov. 7, 2008

(65) Prior Publication Data
US 2009/0175405 A1  Jul. 9, 2009

(30) Foreign Application Priority Data
Jan. 9, 2008  (TW) ............................... 97100843 A

(51) Int. Cl.
*G11C 19/00* (2006.01)
(52) U.S. Cl. ............................. 377/64; 377/68; 377/77; 377/78; 377/79
(58) Field of Classification Search .................. 377/64, 377/68–75, 77–81
See application file for complete search history.

(56) References Cited
U.S. PATENT DOCUMENTS

| | | | |
|---|---|---|---|
| 3,829,711 A | 8/1974 | Crowle | |
| 4,493,691 A | 1/1985 | Calari | |
| 6,747,627 B1 | 6/2004 | Koyama et al. | |
| 7,317,780 B2 * | 1/2008 | Lin et al. | 377/67 |
| 7,333,586 B2 * | 2/2008 | Jang | 377/64 |
| 2005/0084059 A1 | 4/2005 | Yu | |
| 2005/0185752 A1 * | 8/2005 | Sasaki et al. | 377/64 |
| 2006/0239085 A1 | 10/2006 | Wu et al. | |
| 2007/0086558 A1 * | 4/2007 | Wei et al. | 377/64 |
| 2007/0247932 A1 | 10/2007 | Tobita | |
| 2008/0062071 A1 * | 3/2008 | Jeong | 345/46 |
| 2008/0101529 A1 * | 5/2008 | Tobita | 377/64 |
| 2009/0135991 A1 * | 5/2009 | Chen | 377/79 |

FOREIGN PATENT DOCUMENTS

TW 251695 3/2006

* cited by examiner

*Primary Examiner*—Tuan Lam
(74) *Attorney, Agent, or Firm*—Kirton & McConkie; Evan R. Witt

(57) ABSTRACT

A shift register is used for outputting an output pulse at output end in response to a delay of an input pulse received at an input end. The shift register includes a controller, a pre-charging switch, a level shifting switch, and an output generator. The controller is used for generating a level switching signal. The pre-charging switch is used for conducting a first supply voltage to a level shifting node in response to the input pulse. The level shifting switch turns on in response to the level switching signal. The output generator is used for generating the output pulse at the output end, when the level shifting switch turns on.

13 Claims, 23 Drawing Sheets

SHIFT REGISTER

BACKGROUND OF THE INVENTION

1. Field of the Invention

The present invention relates to a shift register, and more particularly, to a shift register with smaller layout area and lower power consumption.

2. Description of Prior Art

With a rapid development of monitor types, novel and colorful monitors with high resolution, e.g., liquid crystal displays (LCDs), are indispensable components used in various electronic products such as monitors for notebook computers, personal digital assistants (PDAs), digital cameras, and projectors. The demand for the novelty and colorful monitors has increased tremendously.

A Low Temperature Poly-Silicon Liquid Crystal Display (LTPS LCD) panel, on account of high resolution, is widely applied to various electronic devices. Referring to FIG. 23 showing a block diagram of a conventional LCD device 10, the LCD device 10 includes a LCD panel 12, a gate driver 14, and a source driver 16. The liquid crystal panel 12 includes a plurality of pixels, each pixel having three pixel units 20 indicating three primary colors, red, green, and blue. For example, the liquid crystal display 12 with 1024 by 768 pixels contains 1024×768×3 pixel units 20. The gate driver 14 periodically outputs a scanning signal to turn on each transistor 22 of the pixel units 20 row by row, meanwhile, each pixel units 20 is charged to a corresponding voltage level based on a data signal from the source driver 16, to show various gray levels. After a row of pixel units is finished to be charged, the gate driver 14 stops outputting the scanning signal to this row, and then outputs the scanning signal to turn on the transistors 22 of the pixel units of the next row sequentially until all pixel units 20 of the liquid crystal panel 12 finish charging, and the gate driver 14 outputs the scanning signal to the first row again and repeats the above-mentioned mechanism.

In conventional liquid crystal displays, the gate driver 14 functions as a shift register. In other words, the gate driver 14 outputs a scanning signal to the liquid crystal panel 12 at a fixed interval. For instance, a liquid crystal panel 12 with 1024×768 pixels and its operating frequency with 60 Hz is provided, the display interval of each frame is about 16.67 ms (i.e., 1/60 second), such that an interval between two scanning signals applied on two row adjacent lines is about 21.7 μs (i.e., 16.67 ms/768). The pixel units 20 are charged and discharged by data voltage from the source driver 16 to show corresponding gray levels in the time period of 21.7 μs accordingly.

Conventionally, the shift registers are classified as two types: one is a static shift register consisting of flip-flops, and the other is a dynamic shift register in which a Field Effect Transistor (FET) conducts in a linear range, and then makes a gate electrode of the FET floating to shift voltage level applied on the gate. Despite the static shift register works steadily, but its switch frequency is slower than dynamic shift register. Further, a large number of transistors used in D-type flip flops of the static shift register occupies larger layout area. By contrast, the dynamic shift register, due to high speed and a less number of transistors used, are widely applied in LCD device. However, the dynamic shift register generates static current and increase the power consumption. Therefore, developing a dynamic shift register with less layout area and lower power consumption is a goal of the LCD industry.

SUMMARY OF THE INVENTION

Briefly summarized, the present invention provides a shift register for outputting an output pulse at output end in response to a delay of an input pulse received at an input end. The shift register comprises a first voltage supply end for providing a first supply voltage, a second voltage supply end for providing a second supply voltage, a controller electrically coupled to the input end for generating a level switching signal based on the input pulse, a first clock signal, a second clock signal inversed to the first clock signal, a pre-charging switch electrically coupled to the first voltage supply end and the input end for conducting the first supply voltage to a level shifting node in response to the input pulse, a level shifting switch turning on in response to the level switching signal, and an output generator electrically coupled to the output end and the level shifting node for generating the output pulse at the output end in response to the second clock signal and voltage on the level shifting node, when the level shifting switch turns on.

According to the present invention, the output generator comprises a first transistor and a second transistor, a gate, a first electrode, and a second electrode of the first transistor being respectively electrically coupled to the level shifting node, the output end, and the second clock signal, and a gate, a first electrode, and a second electrode of the second transistor being respectively electrically coupled to the level switching signal from the controller, the second voltage supply end, and the output end.

According to the present invention, the level shifting switch is a third transistor, and a gate, a first electrode, and a second electrode of the third transistor are respectively electrically coupled to the level switching signal from the controller, the output end, and the level shifting node.

According to the present invention, the pre-charging switch is a fourth transistor, and a gate, a first electrode, and a second electrode of the fourth transistor are respectively electrically coupled to the first clock signal, the input end, and the level shifting node.

According to the present invention, the pre-charging switch is a fourth transistor, and a gate, a first electrode, and a second electrode of the fourth transistor are respectively electrically coupled to the input end, the second voltage supply end, and the level shifting node.

According to the present invention, the shift register further comprises a level compensating capacitor electrically coupled between the gate and the second electrode of the fourth transistor. The level compensating capacitor is a fifth transistor of which a gate is electrically coupled to the input end, and both a first electrode and a second electrode are electrically coupled to the level shifting node.

According to the present invention, the level compensating capacitor is a fifth transistor, and a gate, a first electrode, and a second electrode of the fifth transistor are respectively electrically coupled to the input end, the level shifting node, and the input end.

According to the present invention, the controller comprises an inverter and a sampling switch. The inverter electrically coupled to the input end to receive the input pulse, is used for inverting the input pulse. The sampling switch electrically coupled to the inverter and the level switching node, is used for delivering the inverted input pulse to the level shifting node.

In one aspect, the inverter comprises a sixth transistor and a seventh transistor. The sixth transistor comprises a gate electrically coupled to the second clock signal, and a second electrode electrically coupled to the first voltage supply end. The seventh transistor comprises a gate electrically coupled to the input end, and a first electrode coupling to the second voltage supply end. The sampling switch is an eighth transistor electrically coupled to the inverter and the level shifting node, for delivering the inverted input pulse to the level shifting node.

In another aspect, the inverter comprises a sixth transistor and a seventh transistor. The sixth transistor is a P-type Metal Oxide Semiconductor (PMOS) element of which a gate electrically coupled to the input end, and a second electrode electrically coupled to the first voltage supply end. The seventh transistor is an N-type Metal Oxide Semiconductor (NMOS) element of which a gate electrically coupled to the input end, and a first electrode electrically coupled to the second voltage supply end. The sampling switch is a Complementary Metal Oxide Semiconductor (CMOS) element, for delivering the inverted input pulse to the level shifting node based on the first clock signal and the second clock signal.

According to the present invention, the controller comprises a first inverter, a first sampling switch, a second sampling switch, and a second inverter. The first inverter is electrically coupled to the input end to receive the input pulse, and is for inverting the input pulse. The first sampling switch is electrically coupled to the first inverter and controlled by the second clock signal, and is used for delivering the inverted input pulse. The second sampling switch is electrically coupled to the input end and controlled by the second clock signal, and is used for delivering the input pulse. The second inverter is electrically coupled to the first sampling switch and the second sampling switch, and is used for outputting the level shifting signal to the level shifting node, based on the inverted input pulse from the first sampling switch and the input pulse from the second sampling switch.

In one aspect, the first inverter comprises a sixth transistor and a seventh transistor. The sixth transistor comprises a gate electrically coupled to the second clock signal, and a second electrode electrically coupled to the first voltage supply end. The seventh transistor comprises a gate electrically coupled to the input end, and a first electrode coupling to the second voltage supply end. The first sampling switch is an eighth transistor having a gate electrically coupled to the first clock signal, and the second sampling switch is a ninth transistor having a gate electrically coupled to the first clock signal. The second inverter comprises a tenth transistor and an eleventh transistor. The tenth transistor comprises a gate electrically coupled to the eighth transistor, and a first electrode electrically coupled to the first voltage supply end. The eleventh transistor comprises a gate electrically coupled to the ninth transistor, and a first electrode electrically coupled to the second voltage supply end.

In another aspect, the first inverter comprises a sixth transistor and a seventh transistor. The sixth transistor is a P-type Metal Oxide Semiconductor (PMOS) element, of which a gate electrically coupled to the input end, and a second electrode electrically coupled to the first voltage supply end. The seventh transistor is an N-type Metal Oxide Semiconductor (NMOS) element of which a gate electrically coupled to the input end, and a first electrode electrically coupled to the second voltage supply end. The first sampling switch and the second sampling switch are Complementary Metal Oxide Semiconductors (CMOS) elements. The second inverter comprises a tenth transistor and an eleventh transistor. The tenth transistor comprises a gate electrically coupled to the sampling switch, and a first electrode electrically coupled to the first voltage supply end. The eleventh transistor comprises a gate electrically coupled to the second sampling switch, and a first electrode electrically coupled to the second voltage supply end.

According to the present, the controller comprises an inverter electrically coupled to the input end to receive the input pulse, a sampling switch electrically coupled to the inverter and controlled by the second clock signal, and a clock level shifter electrically coupled to the input end and the sampling switch. The inverter is used for inverting the input pulse. The sampling switch is used for outputting the inverted input pulse. The clock level shifter is used for delivering the level switching signal to the level shifting node based on the inverted input pulse from the sampling signal.

In an aspect, the inverter comprises a sixth transistor and a seventh transistor. The sixth transistor comprises a gate electrically coupled to the second clock signal, and a second electrode electrically coupled to the first voltage supply end. The seventh transistor comprises a gate electrically coupled to the input end, and a first electrode coupling to the second voltage supply end. The sampling switch is an eighth transistor having a gate electrically coupled to the first clock signal. The clock level shifter comprises a ninth transistor, a tenth transistor, and an eleventh transistor. The ninth transistor comprises a gate electrically coupled to the eighth transistor, and a first electrode electrically coupled to the first voltage supply end. The tenth transistor comprises a gate electrically coupled to the input end, and a first electrode electrically coupled to the second voltage supply end. The eleventh transistor comprises a gate electrically coupled to the output end, a first electrode electrically coupled to the second voltage supply end, and a second electrode electrically coupled to the level switching signal.

In another aspect, the inverter comprises a sixth transistor and a seventh transistor. The sixth transistor is a P-type Metal Oxide Semiconductor (PMOS) element of which comprises a gate electrically coupled to the input end, and a second electrode electrically coupled to the first voltage supply end. The seventh transistor is an N-type Metal Oxide Semiconductor (NMOS) element of which comprises a gate electrically coupled to the input end, and a first electrode electrically coupled to the second voltage supply end. The sampling switch is a Complementary Metal Oxide Semiconductor (CMOS) element. The clock level shifter comprises a ninth transistor, a tenth transistor, and an eleventh transistor. The ninth transistor comprises a gate electrically coupled to the sampling switch, and a first electrode electrically coupled to the first voltage supply end. The tenth transistor comprises a gate electrically coupled to the input end, and a first electrode electrically coupled to the second voltage supply end. The eleventh transistor comprises a gate electrically coupled to the output end, a first electrode electrically coupled to the second voltage supply end, and a second electrode electrically coupled to the level switching signal.

According to the present invention, the shift register further comprises a first rest switch electrically coupled to the level shifting node, for resetting the shift register in response to a reset signal. The first reset switch is a twelfth transistor comprising a gate electrically coupled to the reset signal, a first electrode electrically coupled to the level shifting node, and a second electrode electrically coupled to the second voltage supply end.

According to the present invention, the shift register further comprises a second reset switch electrically coupled to input end, for resetting the shift register in response to the reset signal. The second reset switch is a thirteenth transistor comprising a gate electrically coupled to the reset signal, a first electrode electrically coupled to the second voltage supply end, and a second electrode electrically coupled to the input end.

These and other objects of the claimed invention will no doubt become obvious to those of ordinary skill in the art after reading the following detailed description of the preferred embodiment that is illustrated in the various figures and drawings.

DETAILED DESCRIPTION OF THE PREFERRED EMBODIMENTS

Figure 1:
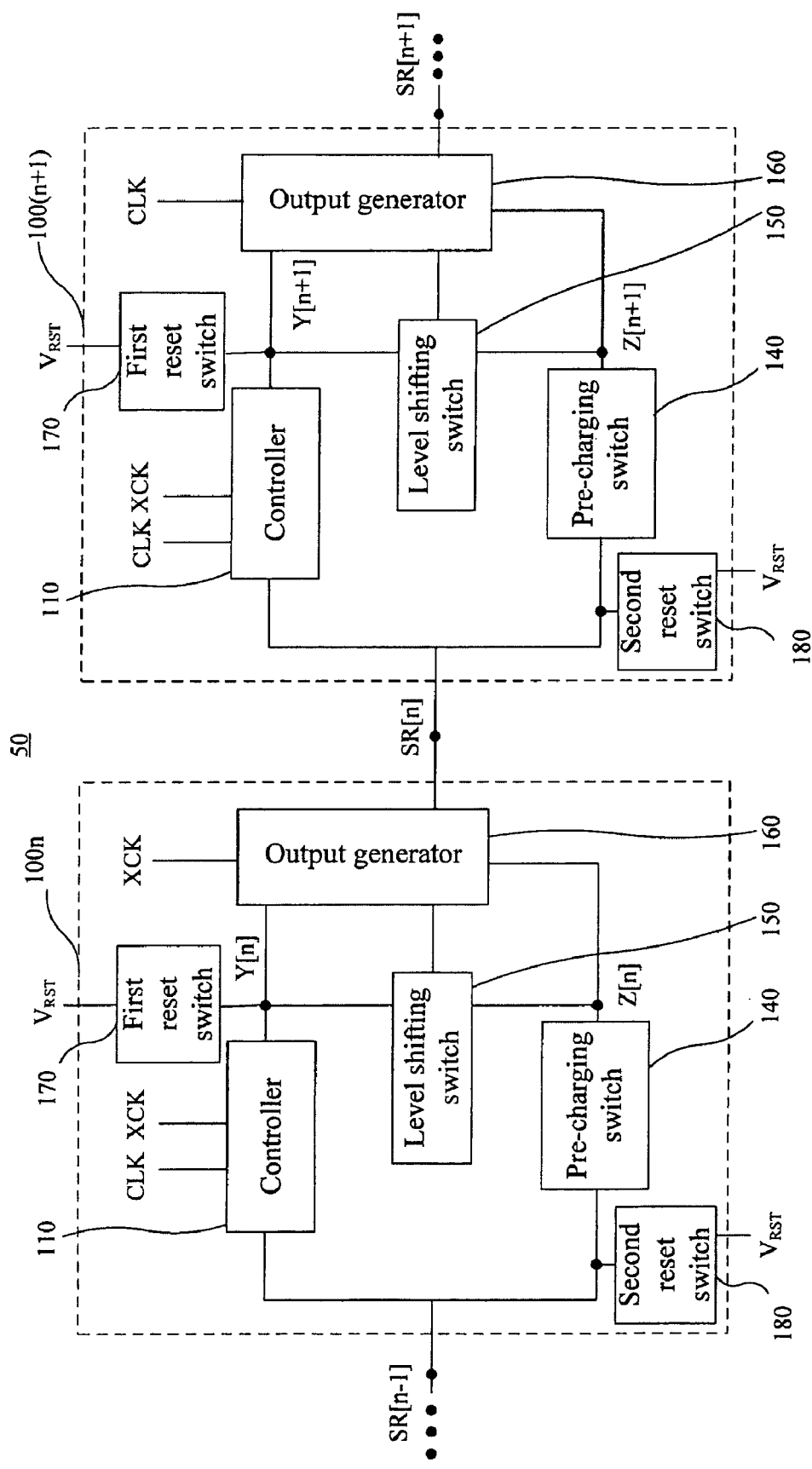
FIG. 1 shows a block diagram of shift register device according to the present invention.
Figure 2:
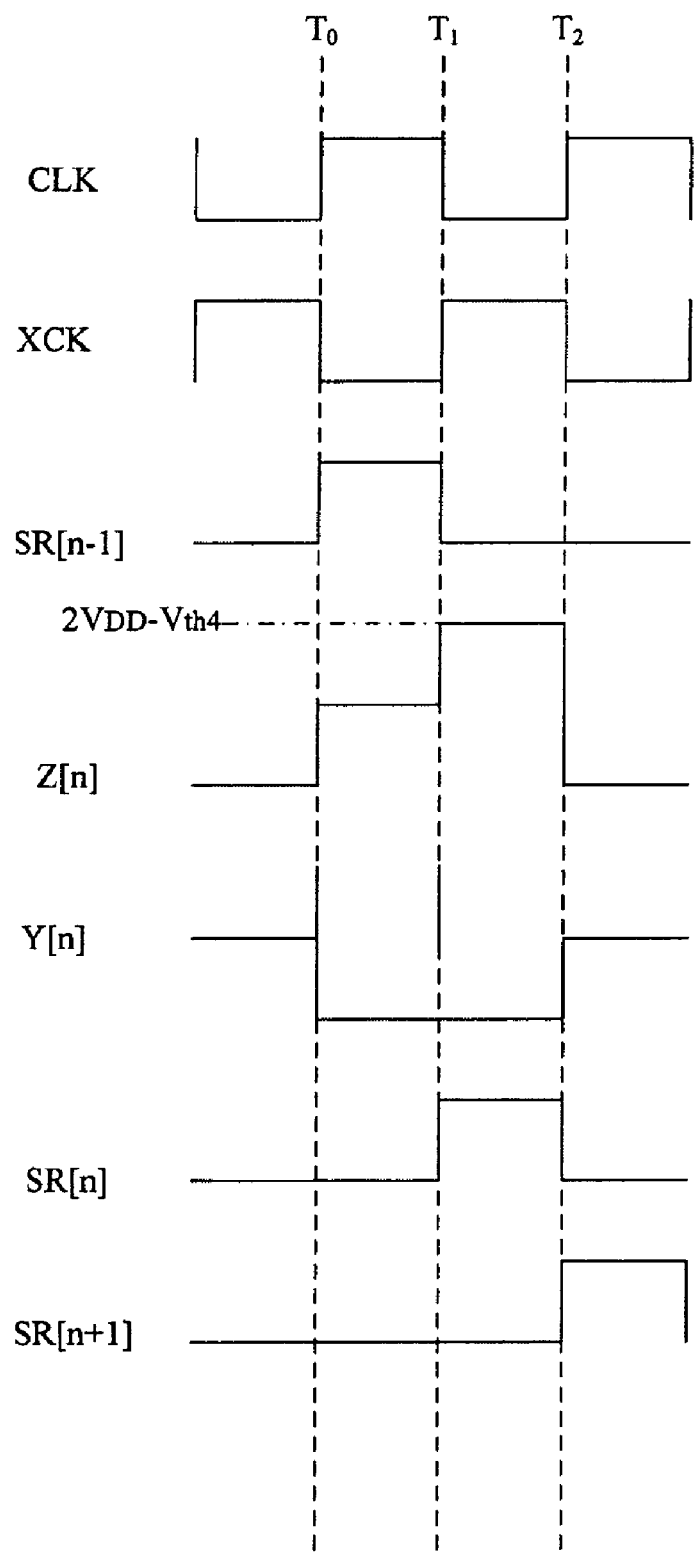
FIG. 2 shows a timing diagram of part nodes of a shift register as shown in FIG. 1.

Referring to FIG. 1 showing a block diagram of shift register device 50 according to the present invention, and FIG. 2 showing a timing diagram of part nodes of a shift register as shown in FIG. 1, the shift register device 50 comprises a plurality of shift registers 100n connected in serial. Each shift register 100n comprises a controller 110, a pre-charging switch 140, a level shifting switch 150, and an output generator 160. The shift register 100n couples to a first voltage supply end to receive supply voltage $V_{DD}$, and a second voltage supply end to receive supply voltage Vss. The shift register 100n delays an input pulse from an input end SR[n−1] by a half cycle of a first clock signal CLK (or a second clock signal XCK which is inversed to the first clock signal), and outputs an output pulse at an output end SR[n]. Upon being triggered by a trigger pulse $V_{ST}$ at input end SR[0], the first stage shift register 1001 delays the trigger pulse $V_{ST}$ by a half cycle of the first clock signal CLK (or the second clock signal XCK), and outputs the delayed pulse (i.e. output pulse) at an output end SR[1]. Thereafter, each shift register 100n delays an input pulse from the output end SR[n−1] of the previous stage shift register 100(n−1) by a half cycle of a first clock signal CLK (or a second clock signal XCK), and outputs an output pulse at the output end SR[n]. In a time period $T_1$-$T_2$, the controller 110 receives the input pulse from the input end SR[n−−], and generates a level switching signal to a level switching node Y[n] based on the first clock signal CLK and the second clock signal XCK. At this moment, the level switching signal is at low logical voltage level. Meanwhile, the pre-charging switch 140 conducts the supply voltage $V_{DD}$ to a level shifting node Z[n] in response to the input pulse. The level shifting switch 150 electrically coupled to the controller 110 is turned on in response to the level switching signal. The output generator 160 generates the output pulse at the output end SR[n] based on the second clock signal XCK and the level shifting signal on the level shifting node Z[n], when the level shifting switch turns on. It is noted that any two adjacent shift registers are identical except that the clock signals CLK and XCK coupling to each corresponding element are interchanged. For instance, the output generator 160 of the shift register 100n is triggered by the clock signal CLK, while the output generator of the shift register 100(n+1) is triggered by the clock signal XCK, and vice versa.

Figure 3:
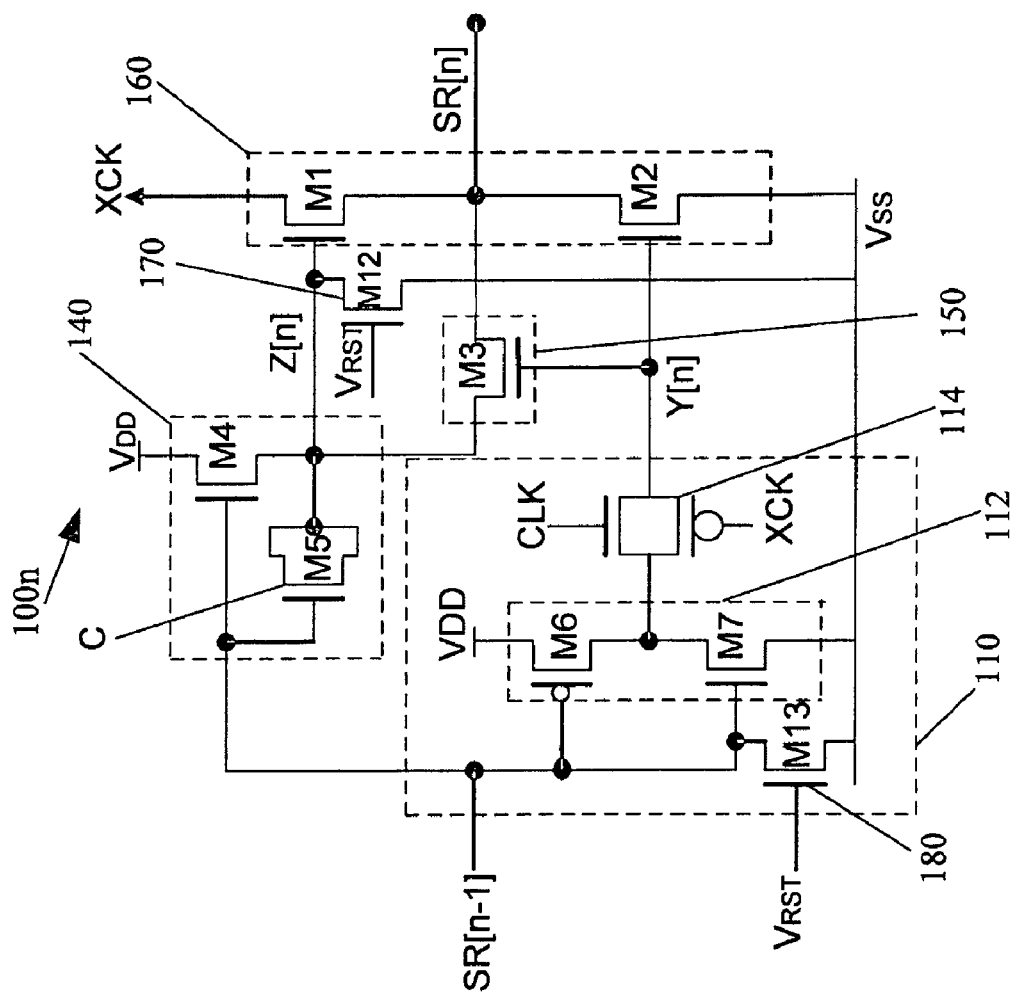
FIG. 3 illustrates a circuit diagram of a first embodiment shift register according to the present invention.

Referring to FIG. 3 illustrating a circuit diagram of a first embodiment shift register 100n according to the present invention, the output generator 160 comprises a first transistor M1 and a second transistor M2. A gate, a first electrode, and a second electrode of the first transistor M1 are respectively electrically coupled to a level shifting node Z[n], output end SR[n], and the click signal XCK. A gate, a first electrode, and a second electrode of the second transistor M2 are respectively electrically coupled to a level switching node Y[n], output end SR[n], and the supply voltage Vss. The level shifting switch 150 comprises a third transistor M3 of which a gate, a first electrode, and a second electrode are respectively electrically coupled to the level switching node Y[n], output end SR[n], and the level shifting node Z[n]. The pre-charging 140 comprises a fourth transistor M4 and a level compensating capacitor C electrically coupled between the gate and source of the fourth transistor M4. The level compensating capacitor C may be implemented by a fifth transistor M5 of which both the source and the drain are electrically coupled to level shifting node Z[n], and the gate is electrically coupled to the input end SR[n−1]. The gate, the drain, the source of the fourth transistor M4 are respectively electrically coupled to the input end SR[n−1], supply voltage $V_{DD}$, and the level shifting node Z[n].

The controller 110 comprises an inverter 112 and a sampling switch 114. The inverter 112 is electrically coupled to the input end SR[n−1] to receive the input pulse, and is used for inverting the input pulse. The sampling switch 114 electrically coupled to the inverter 112 and the level switching node Y[n] is used for delivering the inverted input pulse to the level switching node Y[n]. As shown in FIG. 3, the inverter 112 comprises a sixth transistor M6 and a seventh transistor M7. The sixth transistor M6 may be a P-type Metal-Oxide-Semiconductor (PMOS) element of which a gate is electrically coupled to the input node SR[n−1]. The seventh transistor M7 may be an N-type Metal-Oxide-Semiconductor (NMOS) element, of which a gate is electrically coupled to the input node SR[n−1]. The sampling switch 114 may be implemented by a Complementary Metal-Oxide-Semiconductor (CMOS) element, and is used for delivering the inverted input pulse to the level switching node Y[n] based on the clock signals XCK and CLK. The operation states of the transistor M2 is controlled by voltage on the level shifting node Z[n] which is outputted from the sampling switch 114.

With reference to FIG. 2 and FIG. 3, the shift register 100n is operated over pre-charging period $T_0$-$T_1$ and enabling period $T_1$-$T_2$. During the pre-charging period $T_0$-$T_1$, the transistor M4 of the pre-charging switch 140 turns on due to a trigger of the input pulse, and thus pre-charges to raise voltage on the level shifting node Z[n] to an amount of $V_{DD}$-$V_{th4}$, where $V_{th4}$ is indicative of a threshold voltage of the transistor M4. Meanwhile, the clock signal XCK is at low logical voltage level, and the transistor M1 is turned on accordingly. Furthermore, the inverter 112 also inverts the input pulse to switch off the sampling switch 114, so as to make the level switching signal on the level switching node Y[n] keeping low logical level.

During enabling period $T_1$-$T_2$, the sampling switch 114 delivers the inverted input pulse to the gates of the transistors M2, M3 to turn them off. In a moment of the time $T_1$, the transistor M4 turns off, and thus the level shifting node Z[n] is floating. Meanwhile the clock signal XCK is at high logical voltage level, such that voltage level on the level shifting node Z[n] becomes $2V_{DD}$-$V_{th4}$. Because voltage level on the level shifting node Z[n] has slightly raised due to pre-charging in the pre-charging period $T_0$-$T_1$, the voltage level on the level shifting node Z[n] tends to exceed $V_{DD}$-$V_{th}$, and thus the transistor M1 completely turns on in enabling period $T_1$-$T_2$. In doing so, the transistor M1 drives voltage level on the output end SR[n] to $V_{DD}$ in a duration of enabling period $T_1$-$T_2$.

The level compensating capacitor C enhances the voltage level on the level shifting node Z[n] more close to $V_{DD}$-$Vt_h$ in the duration of pre-charging period $T_0$-$T_1$.

Referring to FIG. 1 and FIG. 3, the shift register 100n further comprises a first rest switch 170 and a second reset switch 180. The first reset switch 170 electrically coupled to the level shifting node Z[n] is used for resetting the shift register 100n in response to a reset signal $V_{RST}$. The second reset switch 180 electrically coupled to the input end SR[n−1] is used for resetting the shift register 100n in response to the reset signal $V_{RST}$ as well. It is note that, preferably, the reset signal is similar to the triggering pulse $V_{ST}$. The first reset switch 170 may be implemented by a twelfth transistor M12 of which a gate, a first electrode, and a second electrode are respectively electrically coupled to the reset signal $V_{RST}$, level shifting node Z[n], and supply voltage Vss. The second reset switch 180 may be implemented by a thirteenth transistor M13 of which a gate, a first electrode, and a second electrode are respectively electrically coupled to the reset signal $V_{RST}$, input end SR[n−1], and supply voltage Vss. The first and second rest switches 170, 180 can turn off transistors M1, M6, M7 to reduce power consumption resulting from static current, when the shift register 100n does not operate.

Although the shift register 100n shown in FIGS. 1 and 3 comprises the first and the second switches 170, 180, the use of the first or second switches 170, 180 is not essential. If either the first switch 170 or the second switch, 180 is adopted, the first stage shift register 1001 must not use the first or second reset switches 170, 180 to avoid abnormal pulse propagation of the first stage shift register 1001 as is reset. If a bi-directional shift register device utilizes the structure of the shift register 100n, the first stage and the last two stage shift register must not remove the first and the second reset switches 170, 180.

Figure 4:
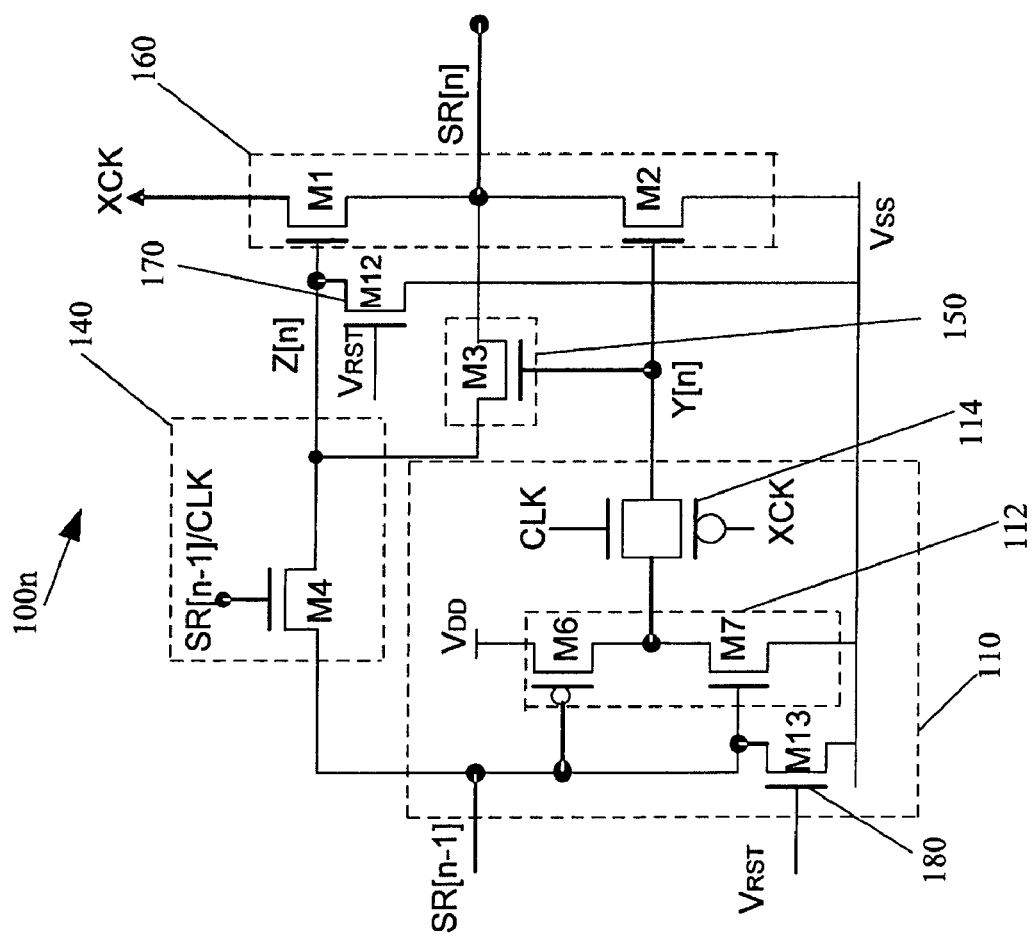
FIG. 4 illustrates a circuit diagram of a second embodiment shift register according to the present invention.

Referring to FIG. 4 illustrating a circuit diagram of a second embodiment shift register 100n according to the present invention, the pre-charging switch 140 comprises a fourth transistor M4 of which a gate, a first electrode, and a second electrode are respectively electrically coupled to the clock signal CLK or the input end SR[n−1], the input end SR[n−1], and the level shifting node Z[n].

Figure 5:
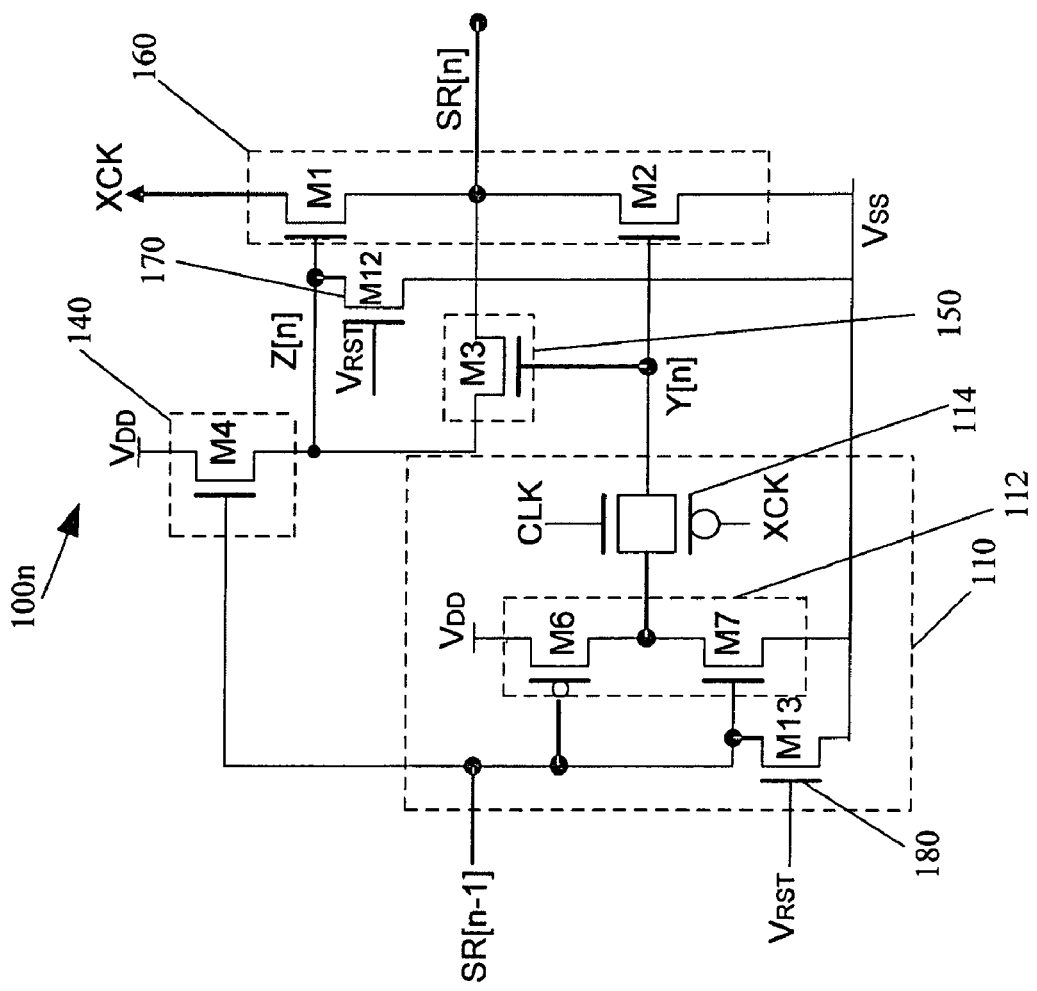
FIG. 5 illustrates a circuit diagram of a third embodiment shift register according to the present invention.

Referring FIG. 5 illustrating a circuit diagram of a third embodiment shift register 100n according to the present invention, the pre-charging switch 140 comprises a fourth transistor M4 of which a gate, a first electrode, and a second electrode are respectively electrically coupled to the input end SR[n−1], the supply voltage $V_{DD}$, and the level shifting node Z[n].

Figure 6:
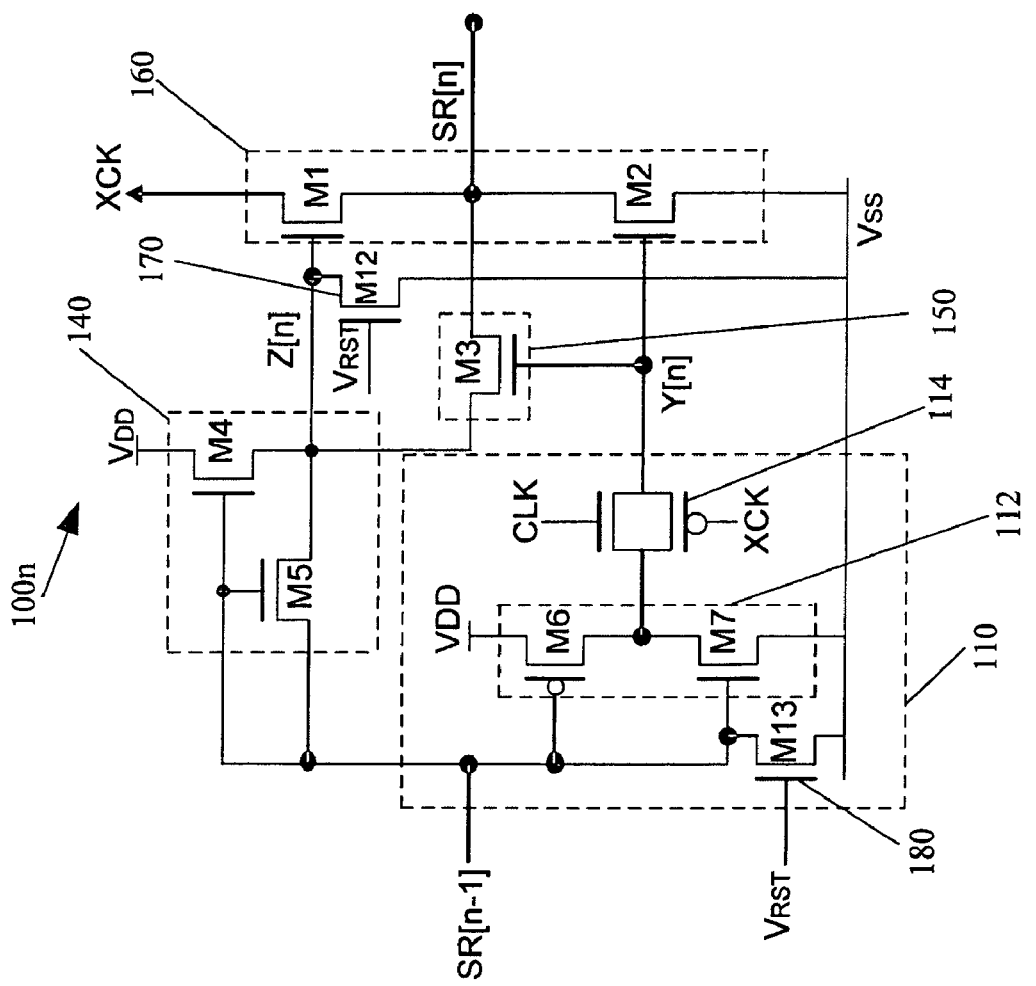
FIG. 6 illustrates a circuit diagram of a fourth embodiment shift register according to the present invention.

Referring FIG. 6 illustrating a circuit diagram of a fourth embodiment shift register 100n according to the present invention, the pre-charging switch 140 comprises a fourth transistor M4 and a fifth transistor M5. A gate, a first electrode, and a second electrode of the fourth transistor M4 are respectively electrically coupled to the input end SR[n−1], the supply voltage $V_{DD}$, and the level shifting node Z[n]. Both a gate and a first electrode of the fifth transistor M5 are electrically coupled to the input end SR[n−1], and a second electrode of the fifth transistor M5 is electrically coupled to the level shifting node Z[n].

Figure 7:
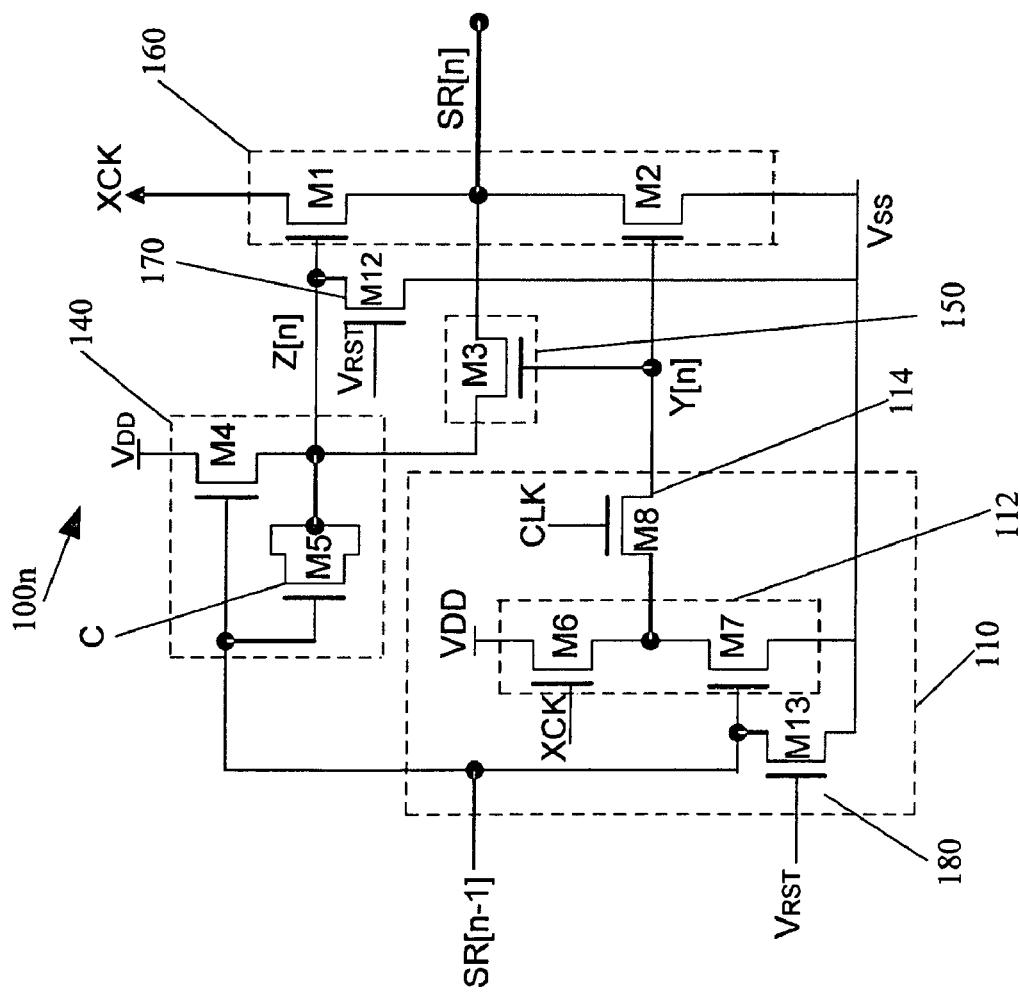
FIG. 7 illustrates a circuit diagram of a fifth embodiment shift register according to the present invention.

Referring FIG. 7 illustrating a circuit diagram of a fifth embodiment shift register 100n according to the present invention, the inverter 112 comprises a sixth transistor M6 and a seventh transistor M7, and both are N-type Metal-Oxide-Semiconductor (NMOS) elements. A gate of the sixth transistor M6 is electrically coupled to the clock signal XCK. A gate of the seventh transistor M7 is electrically coupled to the SR[n−1]. The sampling switch 114 is an NMOS element, and is used for delivering the inverted input pulse to the level shifting node Y[n] based on the clock signal CLK. The operation states of the transistor M2 is controlled by voltage on the level shifting node Z[n] which is outputted from the sampling switch 114.

It is appreciated that as a skilled person in this art is aware, the pre-charging switch 140 shown in FIG. 7 may be substituted by either of the pre-charging switches illustrating in FIGS. 4-6.

Figure 8:
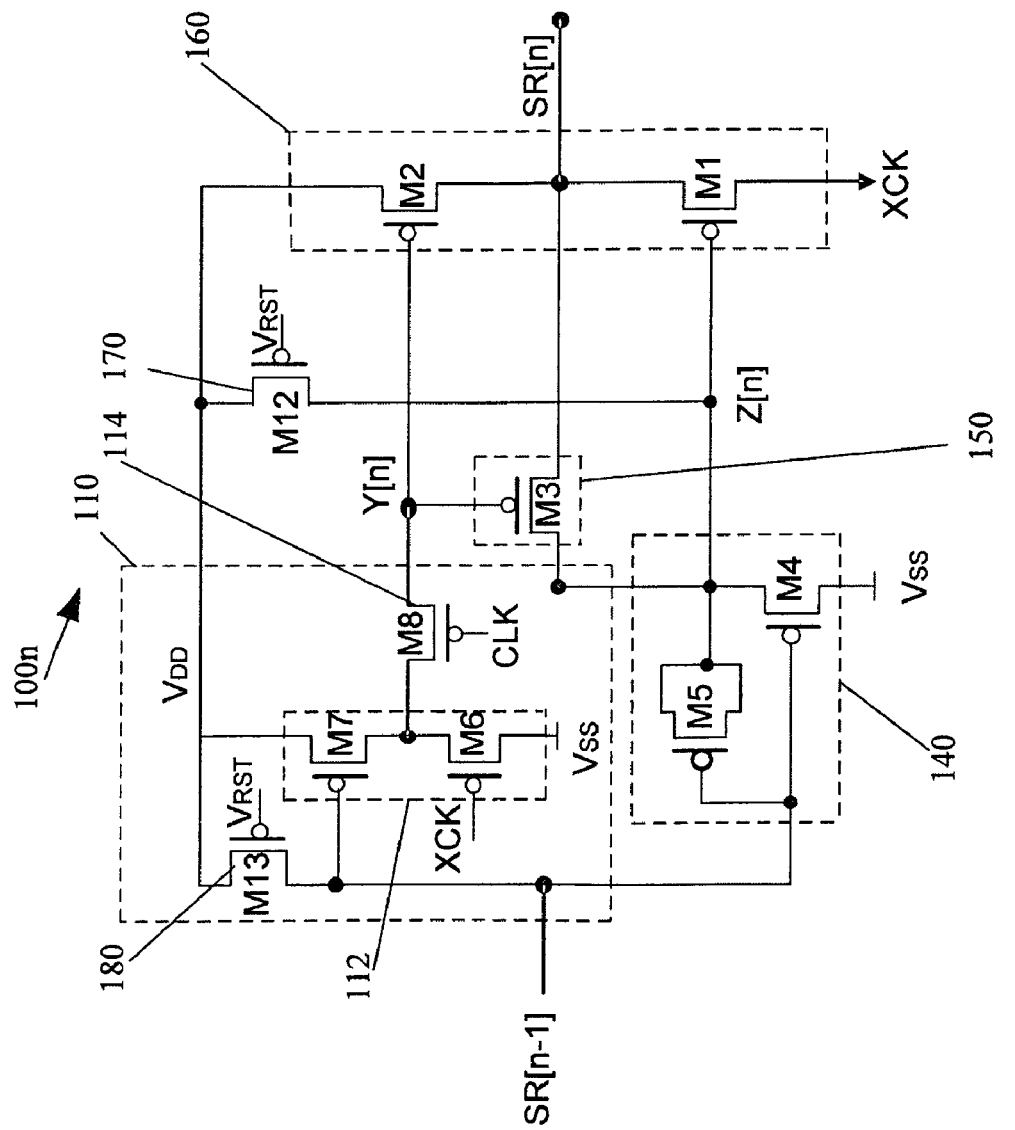
FIG. 8 illustrates a circuit diagram of a sixth embodiment shift register according to the present invention.
Figure 9:
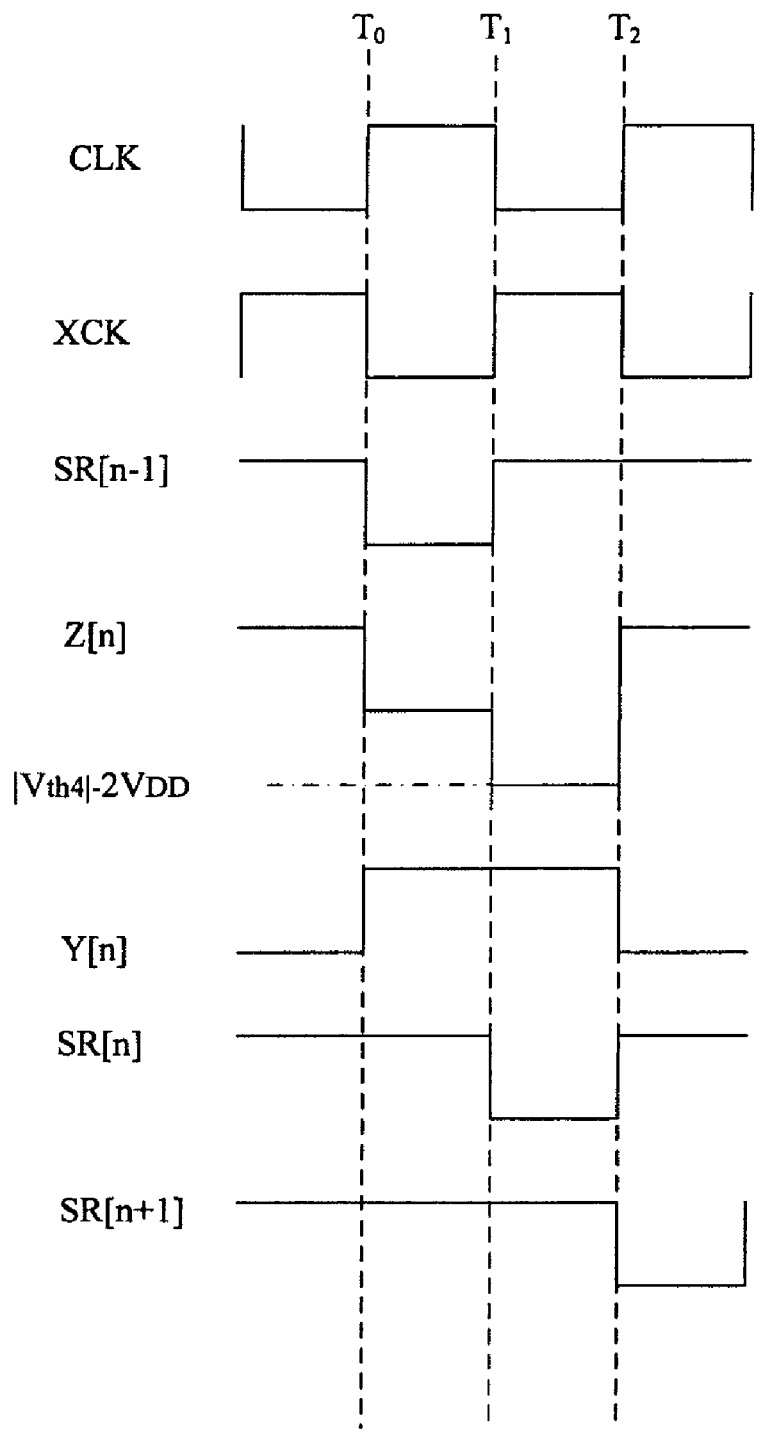
FIG. 9 shows a timing diagram of part nodes of a shift register as shown in FIG. 8.

Referring to FIG. 8 illustrating a circuit diagram of a sixth embodiment shift register 100n according to the present invention, and FIG. 9 showing a timing diagram of part nodes of a shift register as shown in FIG. 8, the shift register 100n of FIG. 8 comprises transistors M1-M8 and M12-M13, and all are PMOS elements. As a skilled person in this art is aware, with reference to FIG. 9, the operation of the transistors M1-M8 and M12-M13 in FIG. 8 is analogous with that in FIG. 3.

Figure 10:
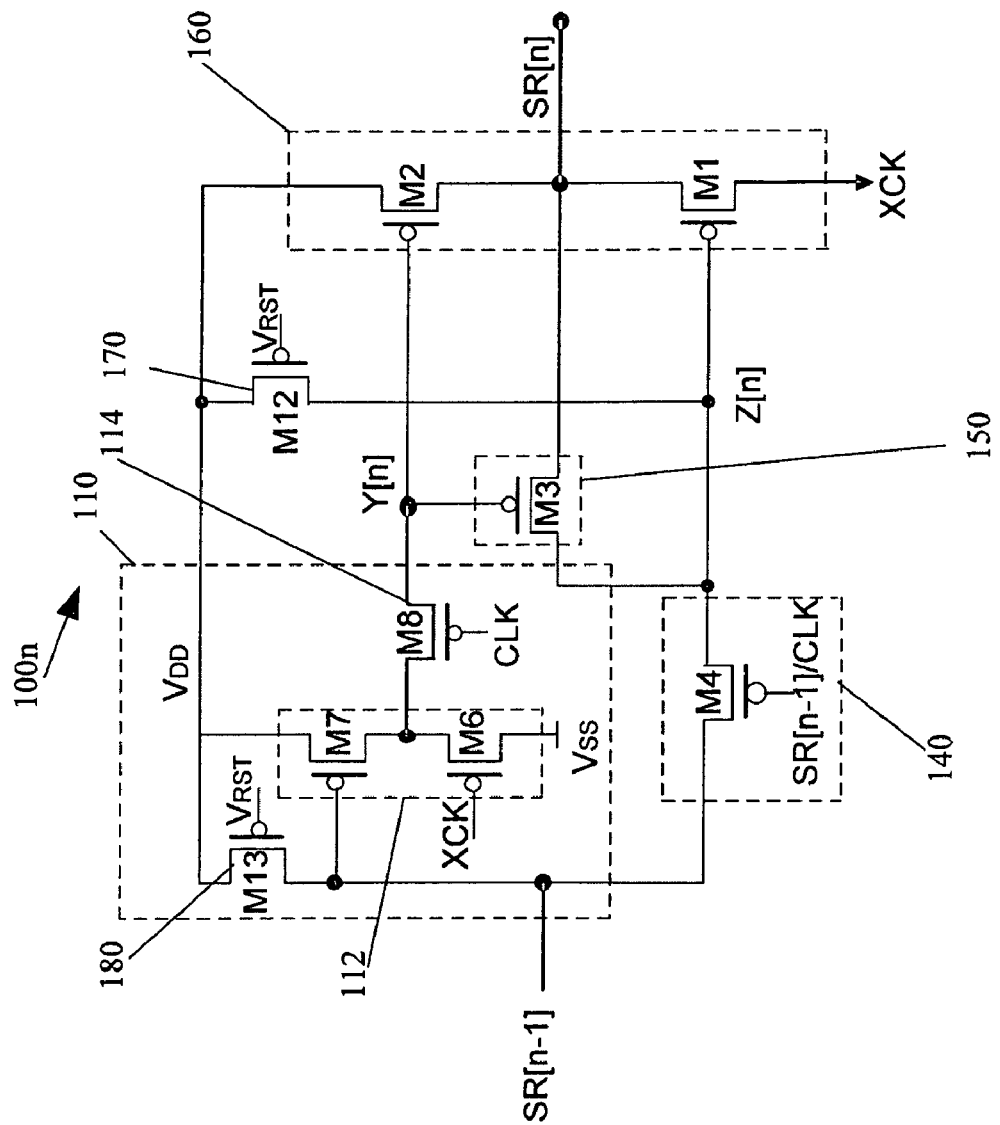
FIG. 10 illustrates a circuit diagram of a seventh embodiment shift register according to the present invention.

Referring to FIG. 10 illustrating a circuit diagram of a seventh embodiment shift register 100n according to the present invention, the pre-charging switch 140 comprises a fourth transistor M4 of which a gate, a first electrode, and a second electrode are respectively electrically coupled to the clock signal CLK or the input end SR[n−1], the input end SR[n−1], and the level shifting node Z[n]. In this seventh embodiment, the fourth transistor M4 is a PMOS element instead of NMOS element.

Figure 11:
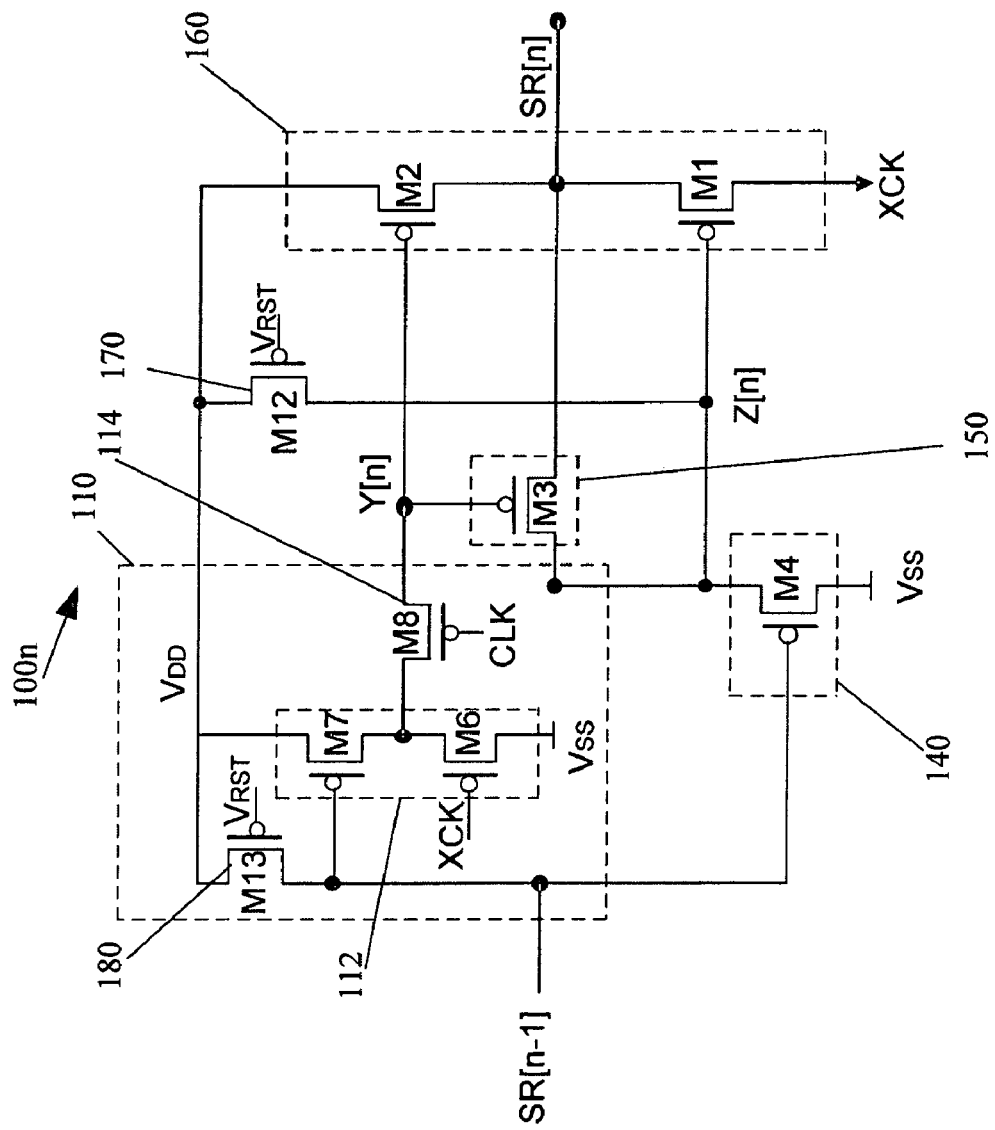
FIG. 11 illustrates a circuit diagram of an eighth embodiment shift register according to the present invention.

Referring FIG. 11 illustrating a circuit diagram of an eighth embodiment shift register 100n according to the present invention, the pre-charging switch 140 comprises a fourth transistor M4 of which a gate, a first electrode, and a second electrode are respectively electrically coupled to the input end SR[n−1], the supply voltage $V_{DD}$, and the level shifting node Z[n]. In this eighth embodiment, the fourth transistor M4 is a PMOS element instead of NMOS element.

Figure 12:
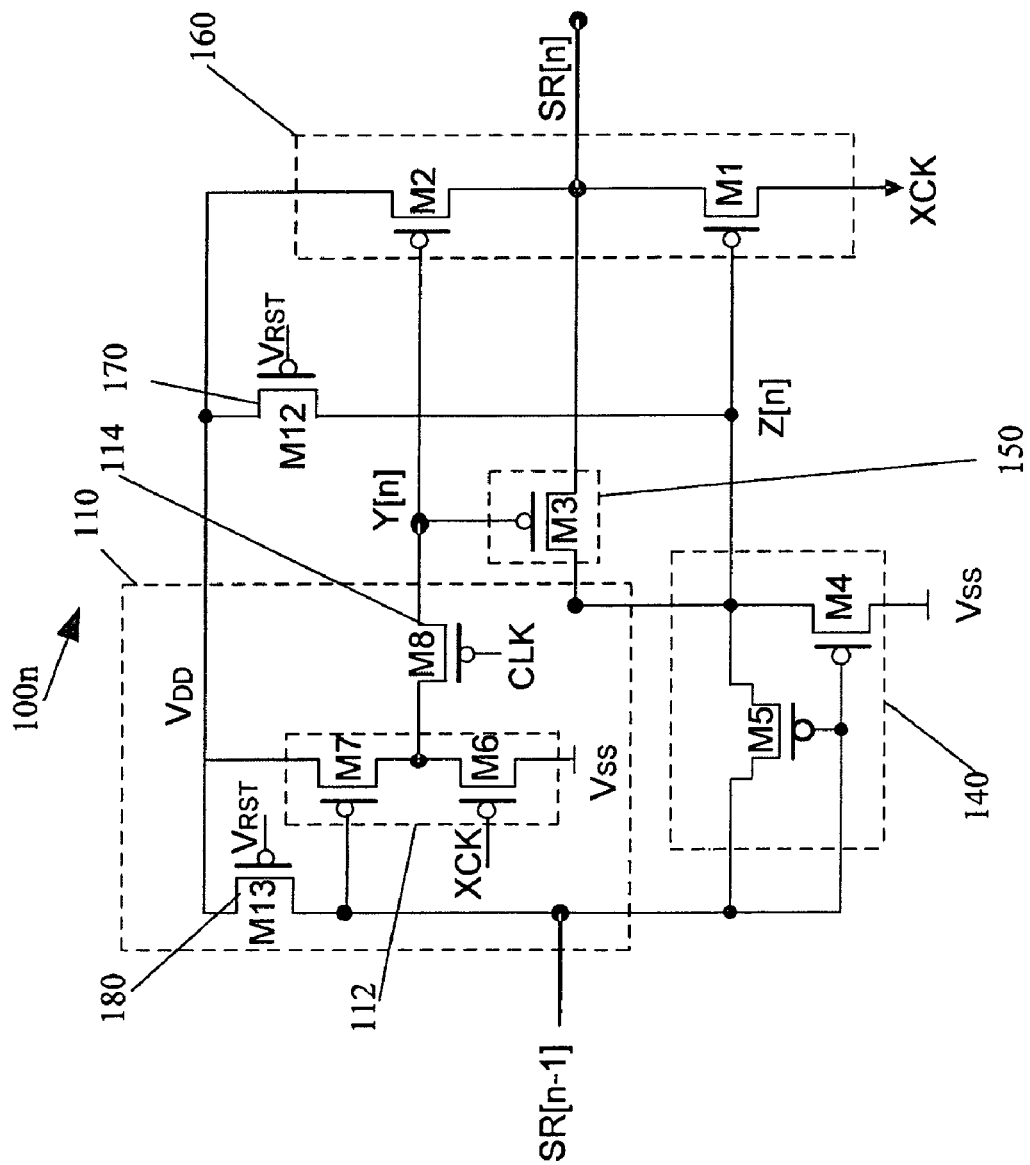
FIG. 12 illustrates a circuit diagram of a ninth embodiment shift register according to the present invention.

Referring FIG. 12 illustrating a circuit diagram of a ninth embodiment shift register 100n according to the present invention, the pre-charging switch 140 comprises a fourth transistor M4 and a fifth transistor M5. A gate, a first electrode, and a second electrode of the fourth transistor M4 are respectively electrically coupled to the input end SR[n−1], the supply voltage $V_{DD}$, and the level shifting node Z[n]. Both a gate and a first electrode of the fifth transistor M5 are electrically coupled to the input end SR[n−1], and a second electrode of the fifth transistor M5 is electrically coupled to the level shifting node Z[n]. In this ninth embodiment, the fourth transistor M4 and the fifth transistor M5 are PMOS elements.

It is noted that the timing diagram related to the shift registers 100n shown in FIGS. 10, 11, 12 are analogous with FIG. 9. The pre-charging switch 140 shown in FIG. 8 may be substituted by one of the pre-charging switches illustrating in FIGS. 10-12.

Figure 13:
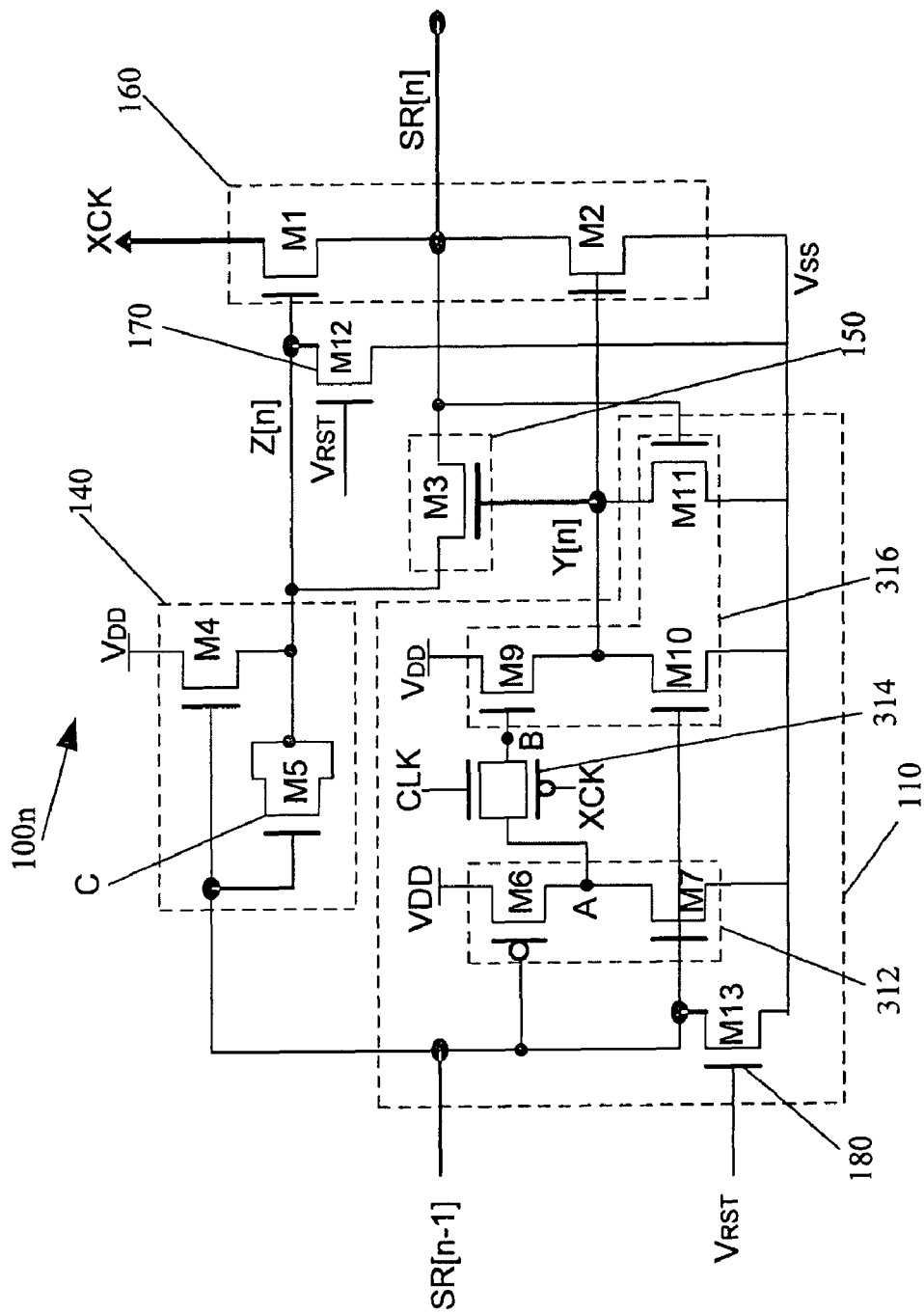
FIG. 13 illustrates a circuit diagram of a tenth embodiment shift register according to the present invention.

Referring to FIG. 13 illustrating a circuit diagram of a tenth embodiment of the shift register 100n according to the present invention, the shift register 100n comprises an inverter 312, a sampling switch 314, and a clock level shifter 316. In this embodiment, the inverter 312 comprises a sixth transistor M6 and a seventh transistor M7. The sixth transistor M6 may be a P-type Metal-Oxide-Semiconductor (PMOS) element of which a gate is electrically coupled to the input node SR[n−1]. The seventh transistor M7 may be an N-type Metal-Oxide-Semiconductor (NMOS) element, of which a gate is electrically coupled to the input node SR[n−1]. The sampling switch 314 may be implemented by a Complementary Metal-Oxide-Semiconductor (CMOS) element. The clock level shifter 316 comprises a ninth transistor M9, a tenth transistor M10, and an eleventh transistor M11. A gate of the ninth transistor M9 is electrically coupled to the sampling switch 314. A gate of the tenth transistor M10 is electrically coupled to the input end SR[n−1]. A gate of the eleventh transistor M11 is electrically coupled to the output end SR[n], and a first electrode and a second electrode of the eleventh transistor M11 are electrically coupled to the level switching node Y[n].

Figure 14:
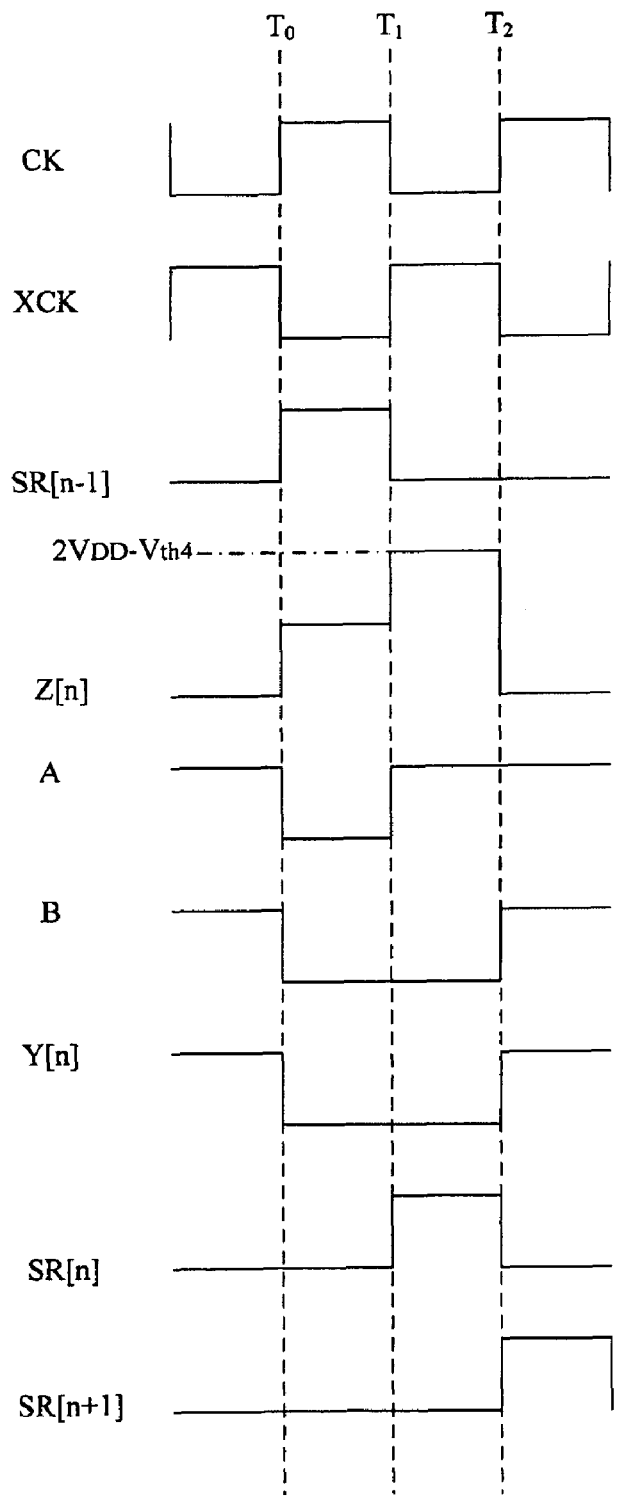
FIG. 14 shows a timing diagram of part nodes of a shift register as shown in FIG. 13.

With reference to FIG. 13 and FIG. 14, the shift register 100n is operated over pre-charging period $T_0$-$T_1$ and enabling period $T_1$-$T_2$. During the pre-charging period $T_0$-$T_1$, the transistor M4 of the pre-charging switch 140 turns on due to a trigger of the input pulse, and thus pre-charges to raise voltage on the level shifting node Z[n] to an amount of $V_{DD}$-$V_{th4}$, where $V_{th4}$ is indicative of a threshold voltage of the transistor M4. Meanwhile, the clock signal XCK is at low logical voltage level, and the transistor M1 is turned on accordingly. Furthermore, the inverter 312 also inverts the input pulse, while the sampling switch 314 is turned off. Therefore, the clock level shifter 316 delivers low logical voltage of the level switching signal to the level switching node Y[n], so as to turn off the transistors M2, M3. In a moment of the time $T_1$, the transistor M4 turns off, and thus the level shifting node Z[n] is floating. Meanwhile the clock signal XCK is at high logical voltage level, such that voltage level on the level shifting node Z[n] becomes $2V_{DD}$-$V_{th4}$. Because voltage level on the level shifting node Z[n] has slightly raised due to pre-charging in the pre-charging period $T_0$-$T_1$, the voltage level on the level shifting node Z[n] tends to exceed $V_{DD}$-$V_{th}$, and thus the transistor M1 completely turns on in enabling period $T_1$-$T_2$. In doing so, the transistor M1 drives voltage level on the output end SR[n] to $V_{DD}$ in a duration of enabling period $T_1$-$T_2$.

The level compensating capacitor C enhances the voltage level on the level shifting node Z[n] more close to $V_{DD}$-$V_{th}$ in the duration of pre-charging period $T_0$-$T_1$.

Referring to FIG. 13, the shift register 100n further comprises a first rest switch 170 and a second reset switch 180. The first reset switch 170 electrically coupled to the level shifting node Z[n] is used for resetting the shift register 100n in response to a reset signal $V_{RST}$. The second reset switch 180 electrically coupled to the input end SR[n−1] is used for resetting the shift register 100n in response to the reset signal $V_{RST}$ as well. It is note that, preferably, the reset signal is similar to the triggering pulse $V_{ST}$. The first reset switch 170 may be implemented by a twelfth transistor M12 of which a gate, a first electrode, and a second electrode are respectively electrically coupled to the reset signal $V_{RST}$, level shifting node Z[n], and supply voltage Vss. The second reset switch 180 may be implemented by a thirteenth transistor M13 of which a gate, a first electrode, and a second electrode are respectively electrically coupled to the reset signal $V_{RST}$, input end SR[n−1], and supply voltage Vss. The first and second rest switches 170, 180 can turn off transistors M1, M6, M7 to reduce power consumption resulting from static current, when the shift register 100n does not operate.

Although the shift register 100n shown in FIG. 13 comprises the first and the second switches 170, 180, the use of the first or second switches 170, 180 is not essential. If either the first or second switches 170, 180 is adopted, the first stage shift register 1001 must not use the first or second reset switches 170, 180 to avoid abnormal pulse propagation of the first stage shift register 1001 as is reset. If a bi-directional shift register device utilizes the structure of the shift register 100n, the first stage and the last two stage shift register must not remove the first and the second reset switches 170, 180. In addition, the pre-charging switch 140 shown in FIG. 13 may be substituted by either of the pre-charging switches illustrating in FIGS. 4-6.

Figure 15:
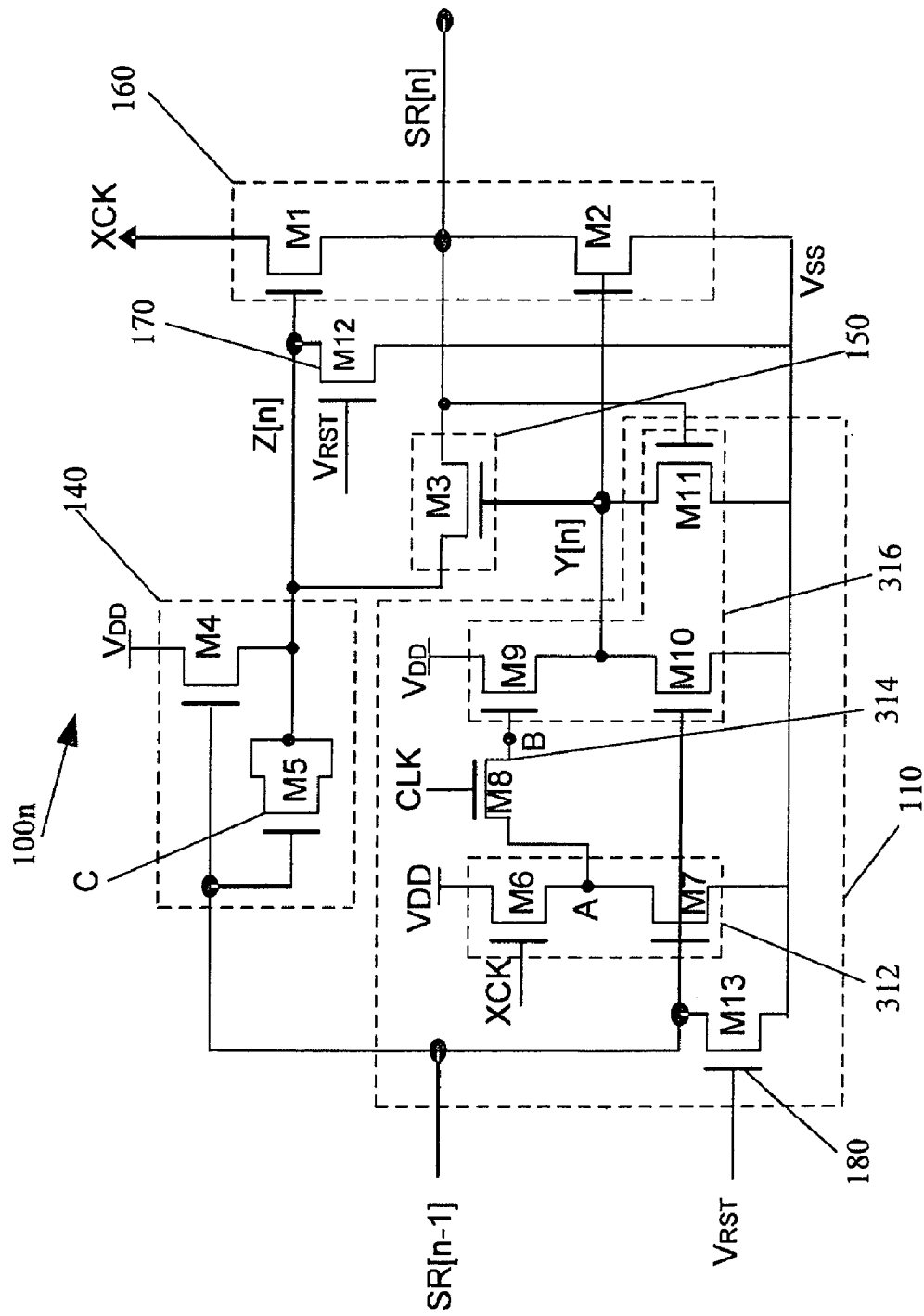
FIG. 15 illustrates a circuit diagram of an eleventh embodiment shift register according to the present invention.

Referring to FIG. 15 illustrating a circuit diagram of an eleventh embodiment of the shift register 100n according to the present invention, the controller 110 shown in FIG. 15 comprises an inverter 312, a sampling switch 314, and a clock level shifter 316. In this eleventh embodiment, the inverter 312 comprises a sixth transistor M6 and a seventh transistor M7. The sampling switch 314 comprises an eighth transistor M8. The clock level shifter 316 comprises a ninth transistor M9, a tenth transistor M10, and an eleventh transistor M11. The transistors M6-M11 may be NMOS elements. A gate of the sixth transistor M6 is electrically coupled to the clock signal XCK. A gate of the seventh transistor M7 is electrically coupled to the input node SR[n−1]. A gate of the ninth transistor M9 is electrically coupled to the sampling switch 314 (i.e. the transistor M8). A gate of the tenth transistor M10 is electrically coupled to the input node SR[n−1]. A gate, a first electrode, and a second electrode of the eleventh transistor M11 are respectively electrically coupled to the input node SR[n−1], the supply voltage Vss, and the level switching node Y[n]. It is appreciated that the operation principle of the shift register 100n shown in FIG. 15 is similar to that shown in FIG.

13, and the pre-charging switch 140 shown in FIG. 15 may be substituted by either of the pre-charging switches illustrating in FIGS. 4-6.

Figure 16:
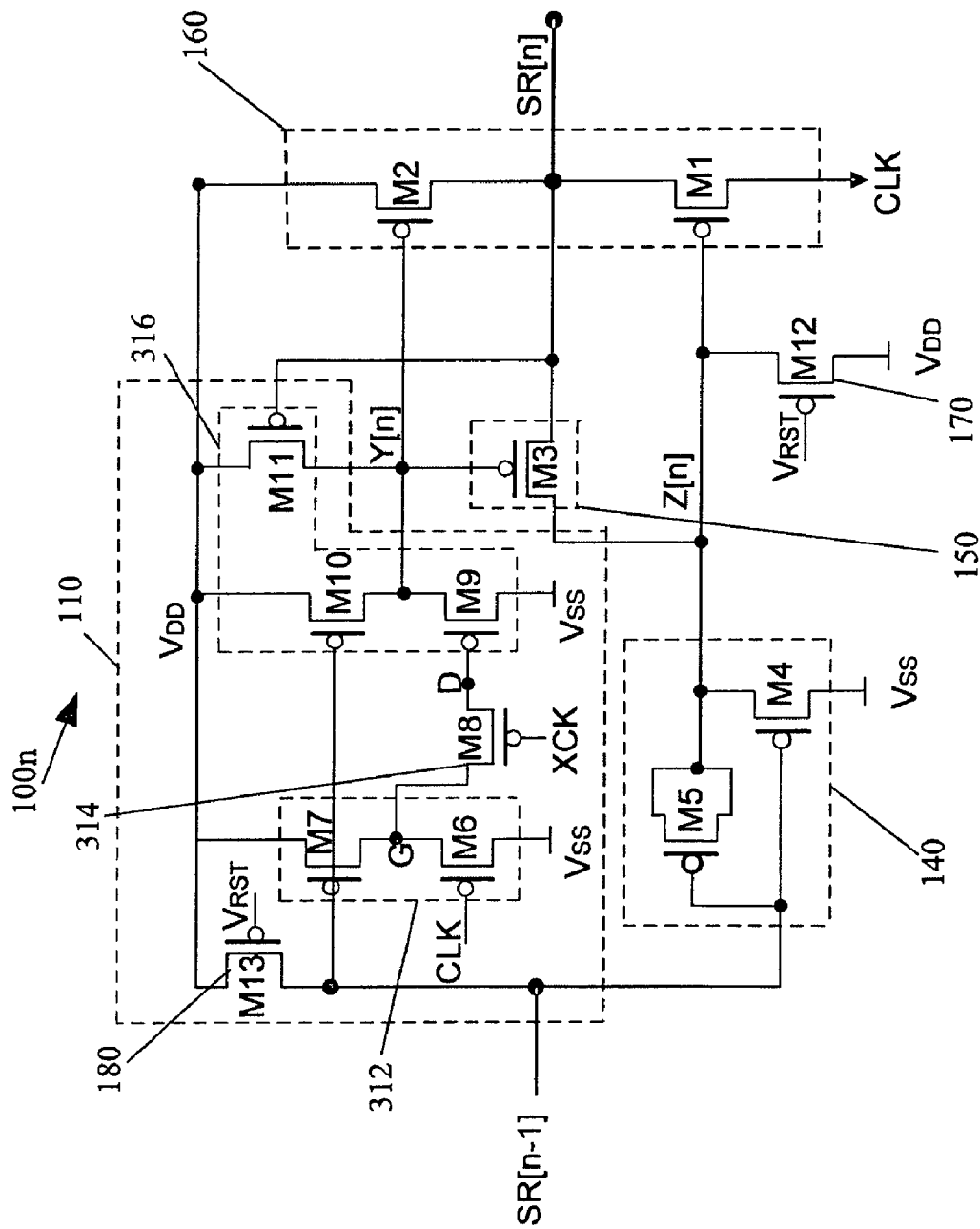
FIG. 16 illustrates a circuit diagram of a twelfth embodiment shift register according to the present invention.
Figure 17:
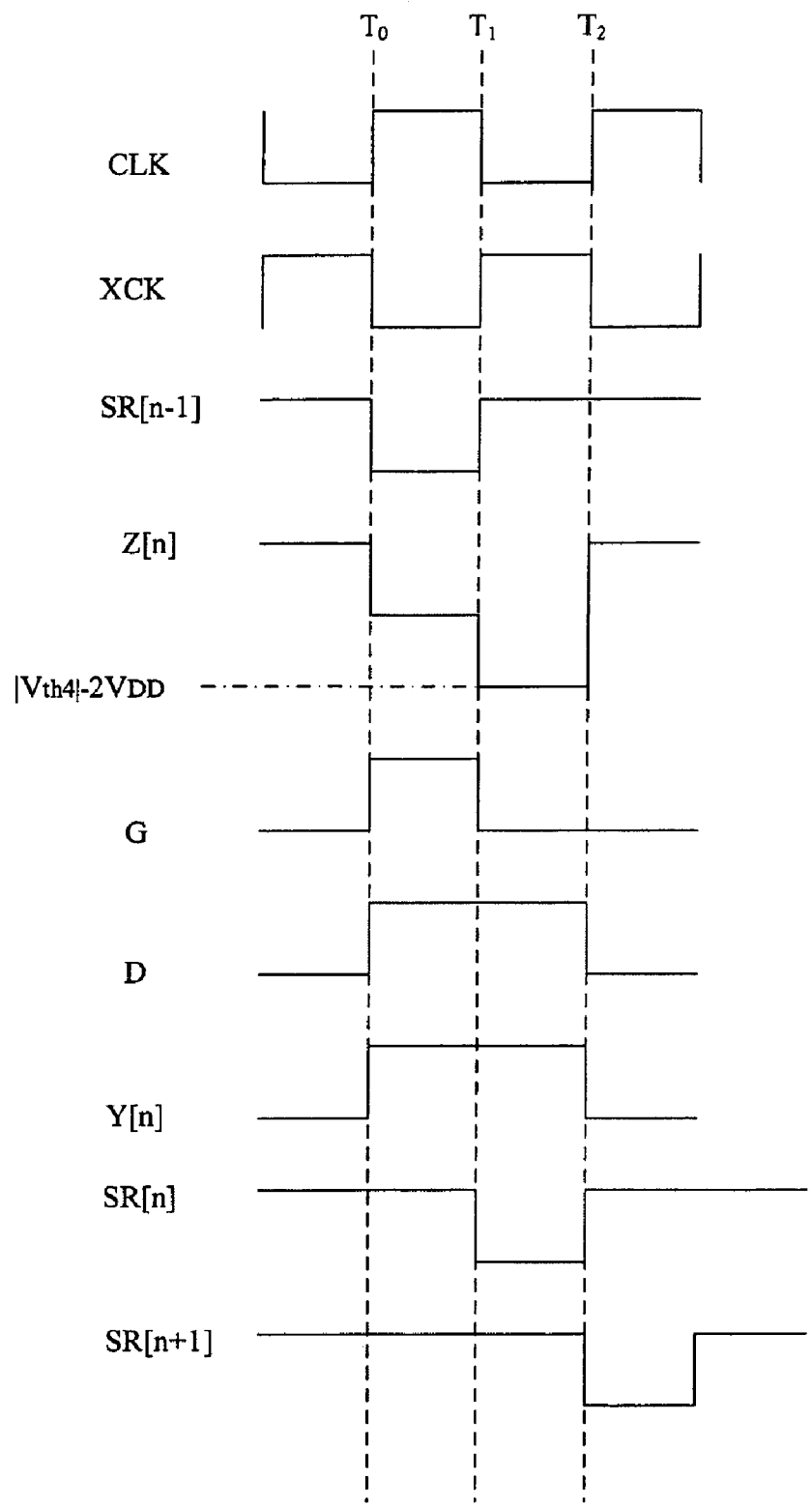
FIG. 17 shows a timing diagram of part nodes of a shift register as shown in FIG. 16.

Referring to FIG. 16 illustrating a circuit diagram of an twelfth embodiment shift register 100n according to the present invention, and FIG. 17 showing a timing diagram of part nodes of a shift register as shown in FIG. 16, the shift register 100n of FIG. 16 comprises transistors M1-M11, and all are PMOS elements. As a skilled person in this art is aware, with reference to FIG. 13, the operation of the transistors M1-M11 in FIG. 16 is analogous with that in FIG. 13.

It is appreciated that the pre-charging switch 140 shown in FIG. 16 may be substituted by either of the pre-charging switches illustrating in FIGS. 10-12.

Figure 18:
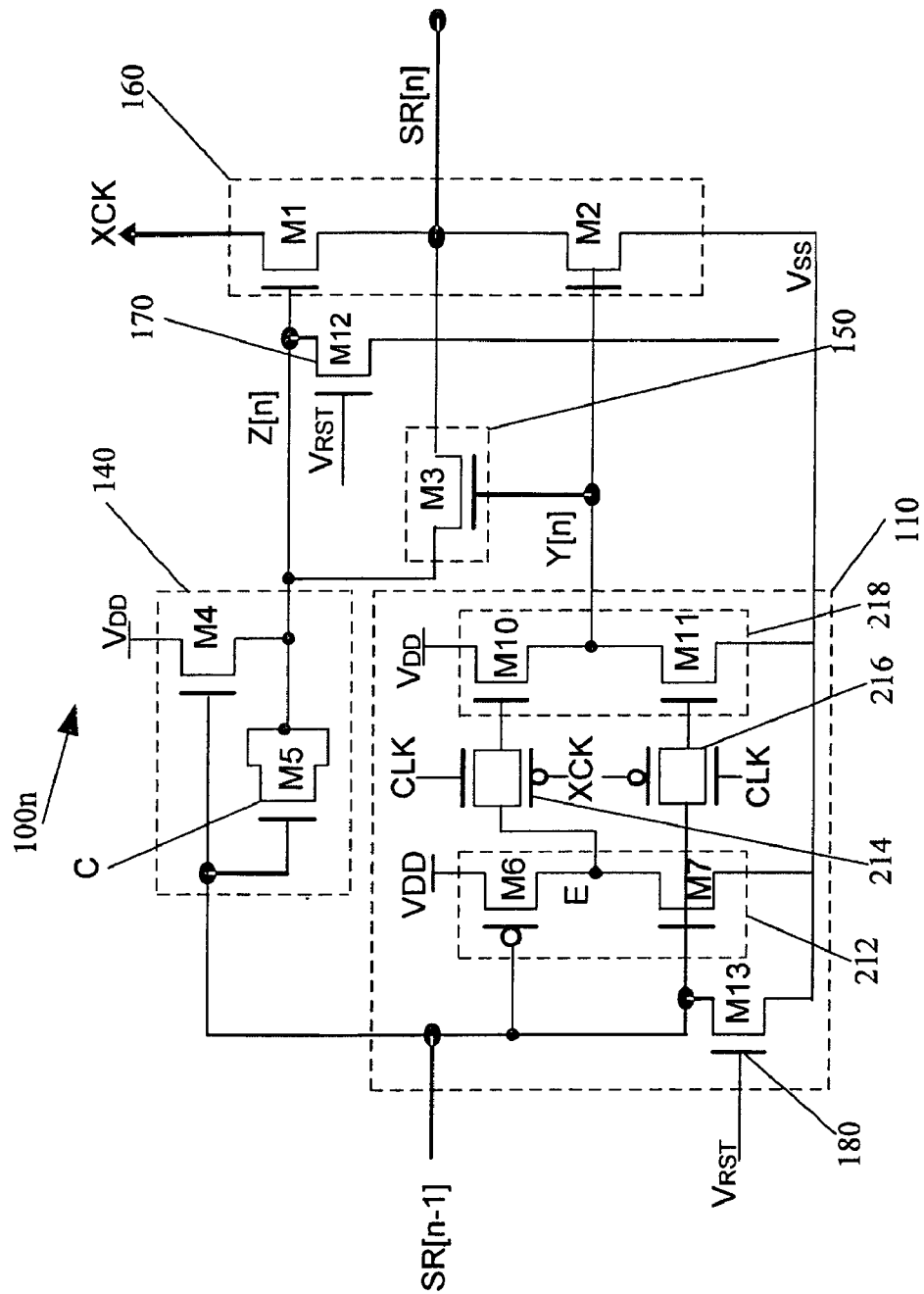
FIG. 18 illustrates a circuit diagram of a thirteenth embodiment shift register according to the present invention.

Referring to FIG. 18 illustrating a circuit diagram of a thirteenth embodiment of the shift register 100n according to the present invention, the controller 110 shown in FIG. 18 comprises a first inverter 212, a first sampling switch 214, a second inverter 216, and a second sampling switch 218. In this thirteenth embodiment, the inverter 212 comprises a sixth transistor M6 and a seventh transistor M7. The sixth transistor M6 may be a P-type Metal-Oxide-Semiconductor (PMOS) element of which a gate is electrically coupled to the input node SR[n−1]. The seventh transistor M7 may be an N-type Metal-Oxide-Semiconductor (NMOS) element, of which a gate is electrically coupled to the input node SR[n−1]. The first and second sampling switches 214, 216 may be implemented by Complementary Metal-Oxide-Semiconductor (CMOS) elements. The second inverter 218 comprises a tenth transistor M10 and an eleventh transistor M11. A gate of the tenth transistor M10 is electrically coupled to the first sampling switch 214. A gate of the eleventh transistor M11 is electrically coupled to the second sampling switch 216. Output of the second inverter 218 is electrically coupled to the transistors M2, M3.

Figure 19:
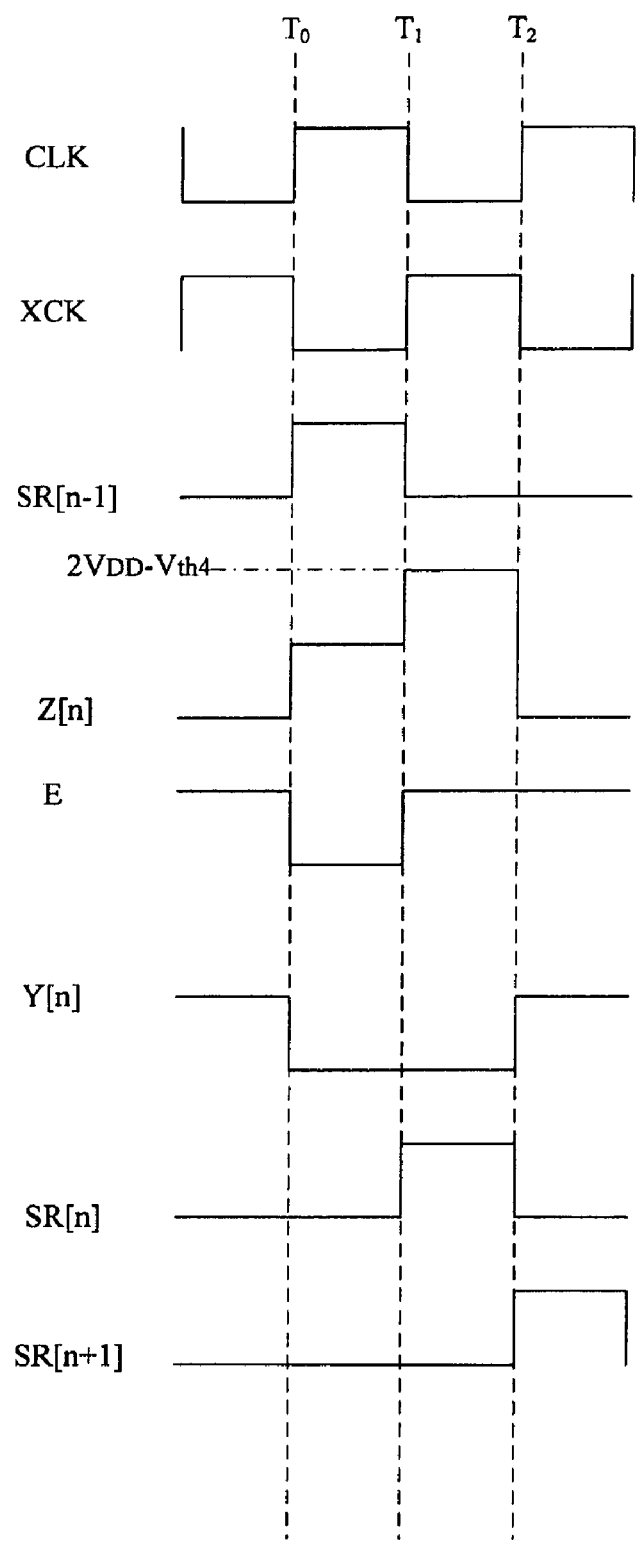
FIG. 19 shows a timing diagram of part nodes of a shift register as shown in FIG. 18.

With reference to FIG. 18 and FIG. 19 showing a timing diagram of part nodes of a shift register as shown in FIG. 18, the shift register 100n of FIG. 18 is operated over pre-charging period $T_0$-$T_1$ and enabling period $T_1$-$T_2$. During the pre-charging period $T_0$-$T_1$, the transistor M4 of the pre-charging switch 140 turns on due to a trigger of the input pulse, and thus pre-charges to raise voltage on the level shifting node Z[n] to an amount of $V_{DD}$-$V_{th4}$, where $V_{th4}$ is indicative of a threshold voltage of the transistor M4. Meanwhile, the clock signal XCK is at low logical voltage level, and the transistor M1 is turned on accordingly. Furthermore, while the sampling switch 314 is turned off, the second sampling switch 216 delivers the inverted input pulse from the first inverter 212 to the gates of the transistors M2 and M3, so as to turn off the transistors M2, M3. In a moment of the time $T_1$, the transistor M4 turns off, and thus the level shifting node Z[n] is floating during the enabling period $T_1$-$T_2$. Meanwhile the clock signal XCK is at high logical voltage level, such that voltage level on the level shifting node Z[n] becomes $2V_{DD}$-$V_{th4}$. Because voltage level on the level shifting node Z[n] has slightly raised due to pre-charging in the pre-charging period $T_0$-$T_1$, the voltage level on the level shifting node Z[n] tends to exceed $V_{DD}$-$V_{th}$, and thus the transistor M1 completely turns on in enabling period $T_1$-$T_2$. In doing so, the transistor M1 drives voltage level on the output end SR[n] to $V_{DD}$ in a duration of enabling period $T_1$-$T_2$.

The level compensating capacitor C enhances the voltage level on the level shifting node Z[n] more close to $V_{DD}$-$V_{th}$ in the duration of pre-charging period $T_0$-$T_1$.

Referring to FIG. 18, the shift register 100n further comprises a first rest switch 170 and a second reset switch 180. The first reset switch 170 electrically coupled to the level shifting node Z[n] is used for resetting the shift register 100n in response to a reset signal $V_{RST}$. The second reset switch 180 electrically coupled to the input end SR[n−1] is used for resetting the shift register 100n in response to the reset signal $V_{RST}$ as well. It is note that, preferably, the reset signal is similar to the triggering pulse $V_{ST}$. The first reset switch 170 may be implemented by a twelfth transistor M12 of which a gate, a first electrode, and a second electrode are respectively electrically coupled to the reset signal $V_{RST}$, level shifting node Z[n], and supply voltage Vss. The second reset switch 180 may be implemented by a thirteenth transistor M13 of which a gate, a first electrode, and a second electrode are respectively electrically coupled to the reset signal $V_{RST}$, input end SR[n−1], and supply voltage Vss. The first and second rest switches 170, 180 can turn off transistors M1, M6, M7 to reduce power consumption resulting from static current, when the shift register 100n does not operate.

Although the shift register 100n shown in FIG. 18 comprises the first and the second switches 170, 180, the use of the first or second switches 170, 180 is not essential. If either the first or second switches 170, 180 is adopted, the first stage shift register 1001 must not use the first or second reset switches 170, 180 to avoid abnormal pulse propagation of the first stage shift register 1001 as is reset. If a bi-directional shift register device utilizes the structure of the shift register 100n, the first stage and the last two stage shift register must not remove the first and the second reset switches 170, 180. In addition, the pre-charging switch 140 shown in FIG. 18 may be substituted by either of the pre-charging switches illustrating in FIGS. 4-6.

Figure 20:
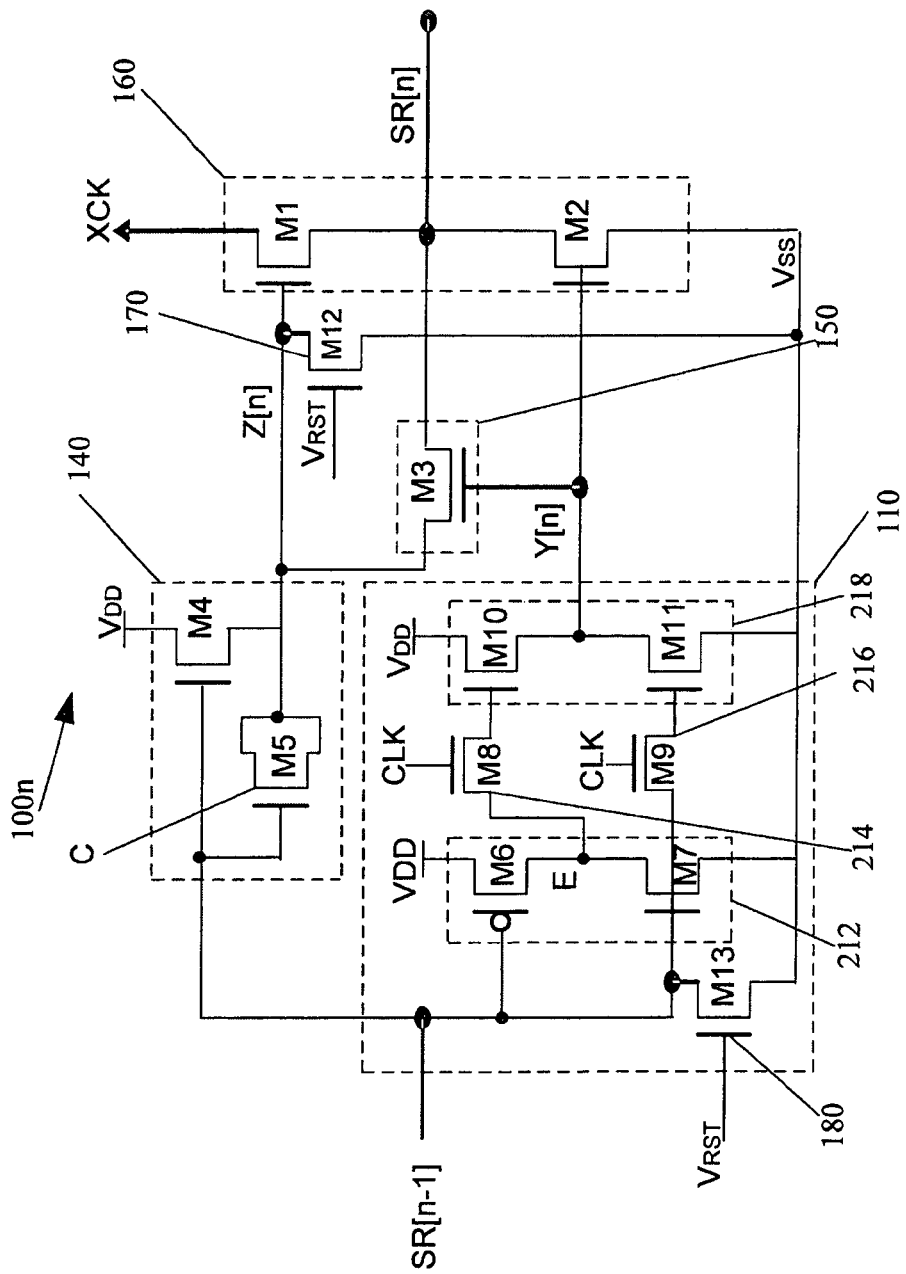
FIG. 20 illustrates a circuit diagram of a fourteenth embodiment shift register according to the present invention.

Referring to FIG. 20 illustrating a circuit diagram of a fourteenth embodiment of the shift register 100n according to the present invention, the controller 110 shown in FIG. 20 comprises a first inverter 212, a first sampling switch 214, a second sampling switch 216, and a second sampling circuit 218. In this fourteenth embodiment, the first inverter 212 comprises a sixth transistor M6 and a seventh transistor M7. The first sampling switch 214 comprises an eighth transistor M8. The second sampling switch 216 comprises a ninth transistor M9. The second inverter 218 comprises a tenth transistor M10, an eleventh transistor M11, and a twelfth transistor M12. The transistors M6-M11 may be NMOS elements. A gate of the sixth transistor M6 is electrically coupled to the clock signal XCK. A gate of the seventh transistor M7 is electrically coupled to the input node SR[n−1]. A gate of the tenth transistor M10 is electrically coupled to the first sampling switch 214 (i.e. the transistor M8). A gate of the eleventh transistor M11 is electrically coupled to the second sampling switch 216 (i.e. the transistor M9). Output of the second inverter 218 is electrically coupled to the level switching node Y[n]. It is appreciated that the operation principle of the shift register 100n shown in FIG. 20 is similar to that shown in FIG. 18, and the pre-charging switch 140 shown in FIG. 20 may be substituted by either of the pre-charging switches illustrating in FIGS. 4-6.

Figure 21:
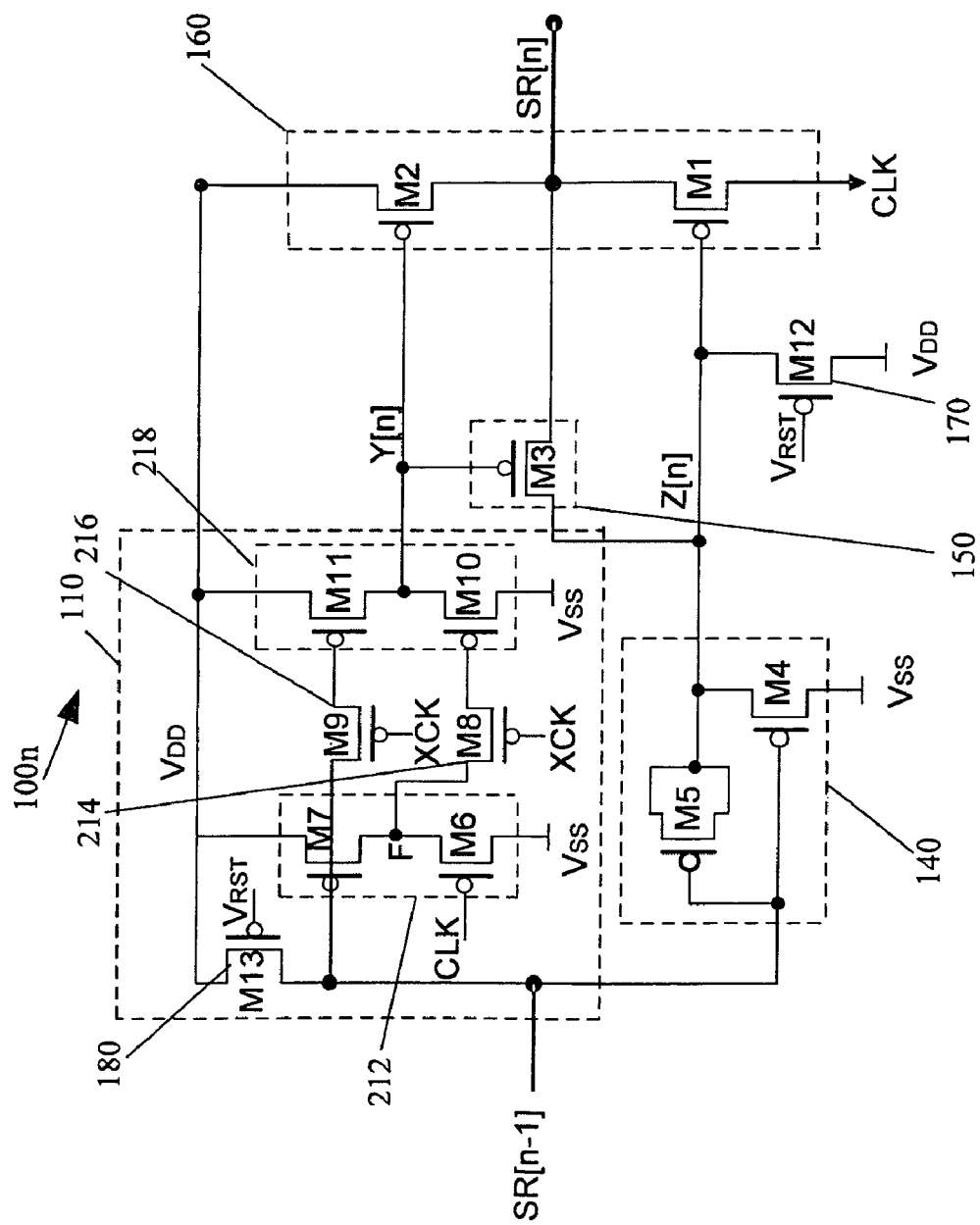
FIG. 21 illustrates a circuit diagram of a fifteenth embodiment shift register according to the present invention.
Figure 22:
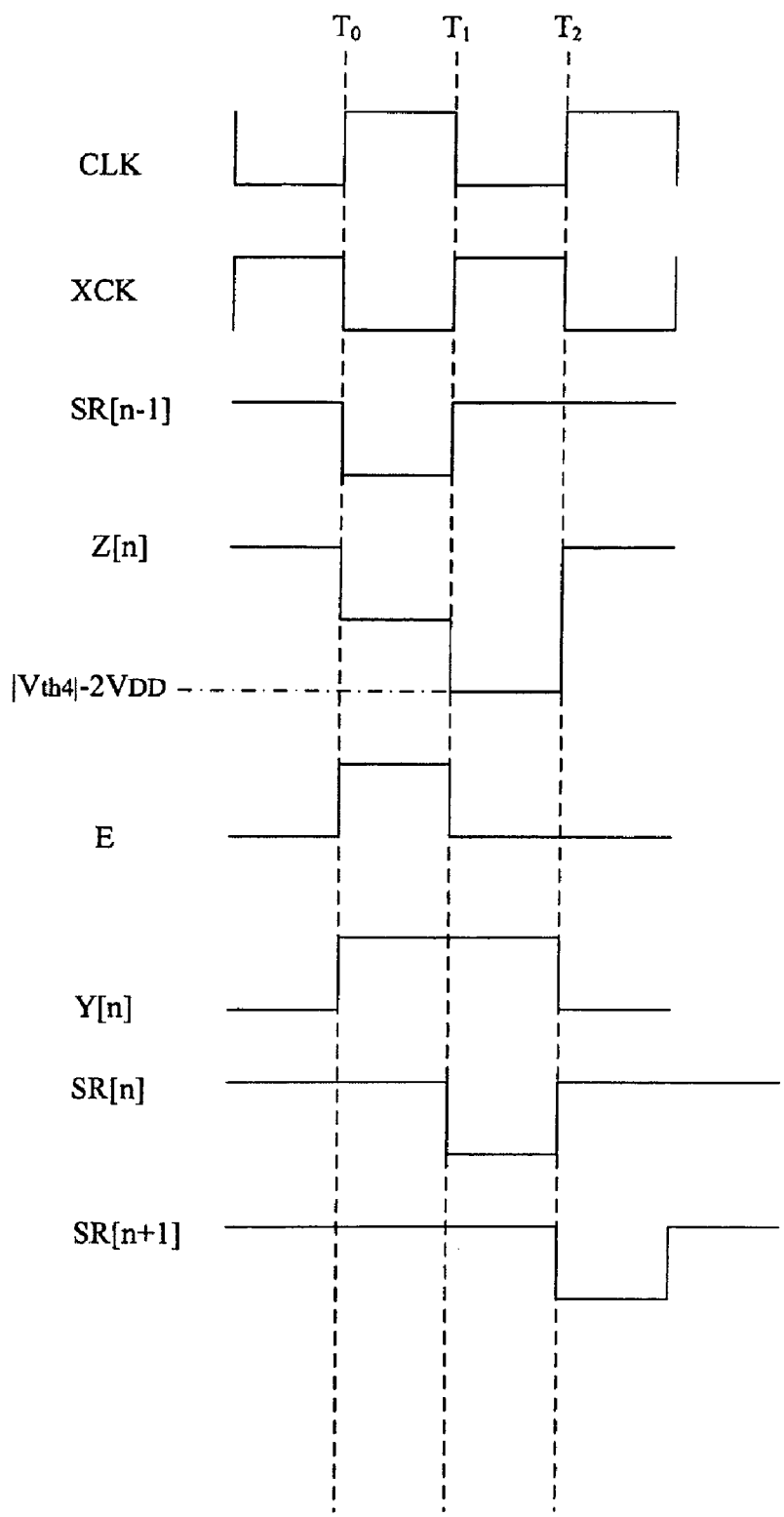
FIG. 22 shows a timing diagram of part nodes of a shift register as shown in FIG. 21.
Figure 23:
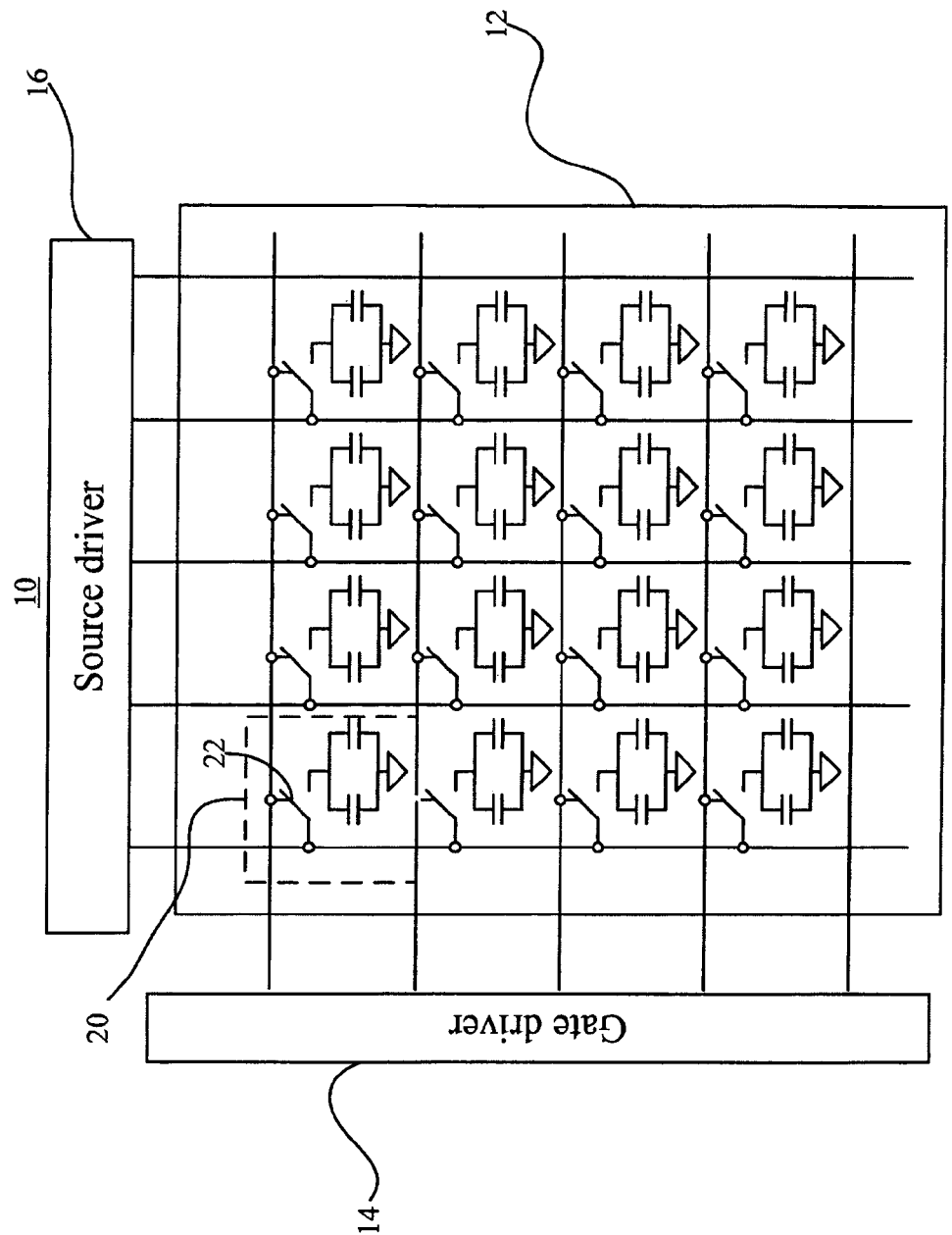
FIG. 23 shows a block diagram of a conventional LCD device.

Referring to FIG. 21 illustrating a circuit diagram of a fifteenth embodiment shift register 100n according to the present invention, and FIG. 22 showing a timing diagram of part nodes of a shift register as shown in FIG. 21, the shift register 100n of FIG. 21 comprises transistors M1-M13, and all are PMOS elements. As a skilled person in this art is aware, with reference to FIG. 21, the operation of the transistors M1-M13 in FIG. 21 is analogous with that in FIG. 20. It is appreciated that the pre-charging switch 140 shown in FIG. 21 may be substituted by either of the pre-charging switches illustrating in FIGS. 10-12.

In contrast to prior art, the present inventive shift register has features of: 1. faster operating speed; 2. a less number of transistors than conventional static shift register; 3. lower power consumption than conventional static shift register; 4. properly manufacturing with PMOS and NMOS processes. As a result, the present inventive shift register meets a requirement of LCD device.

Although the present invention has been explained by the embodiments shown in the drawings described above, it should be understood to the ordinary skilled person in the art that the invention is not limited to the embodiments, but rather various changes or modifications thereof are possible without departing from the spirit of the invention. Accordingly, the scope of the invention shall be determined only by the appended claims and their equivalents.

What is claimed is:

1. A shift register for outputting an output pulse at an output end in response to a delay of an input pulse received at an input end, comprising:
    a first voltage supply end for providing a first supply voltage;
    a second voltage supply end for providing a second supply voltage;
    a controller electrically coupled to the input end, for generating a level switching signal in response to the input pulse, a first clock signal, and a second clock signal complementary to the first clock signal;
    a pre-charging switch electrically coupled to the first voltage supply end and the input end, for conducting the first supply voltage to a level shifting node in response to the input pulse;
    a level shifting switch electrically coupled to the controller and the level shifting node, turning on in response to the level switching signal, wherein the level shifting switch is a first transistor, and a gate, a first electrode, and a second electrode of the first transistor are respectively electrically coupled to the level switching signal from the controller, the output end, and the level shifting node; and
    an output generator electrically coupled to the output end and the level shifting node, for generating the output pulse at the output end in response to the second clock signal and voltage on the level shifting node, when the level shifting switch turns on.

2. The shift register of claim 1, wherein the output generator comprises a second transistor and a third transistor, a gate, a first electrode, and a second electrode of the second transistor being respectively electrically coupled to the level shifting node, the output end, and the second clock signal, and a gate, a first electrode, and a second electrode of the third transistor being respectively electrically coupled to the level switching signal from the controller, the second voltage supply end, and the output end.

3. The shift register of claim 1, wherein the pre-charging switch is a second transistor, and a gate, a first electrode, and a second electrode of the second transistor are respectively electrically coupled to the input end, the first voltage supply end, and the level shifting node.

4. The shift register of claim 3, further comprising a level compensating capacitor electrically coupled between the gate and the second electrode of the second transistor.

5. The shift register of claim 4, wherein the level compensating capacitor is a third transistor of which a gate is electrically coupled to the input end, and both a first electrode and a second electrode are electrically coupled to the level shifting node.

6. The shift register of claim 1, wherein the controller comprises:
    an inverter electrically coupled to the input end to receive the input pulse, for inverting the input pulse;
    a sampling switch electrically coupled to the inverter and controlled by the second clock signal, for outputting the inverted input pulse; and
    a clock level shifter electrically coupled to the input end and the sampling switch, for delivering the level switching signal based on the inverted input pulse from the sampling signal.

7. The shift register of claim 6, wherein the inverter comprises:
    a second transistor, comprising a gate electrically coupled to the first clock signal, and a second electrode electrically coupled to the first voltage supply end; and
    a third transistor, comprising a gate electrically coupled to the input end, and a first electrode coupling to the second voltage supply end.

8. The shift register of claim 7, wherein the sampling switch is an fourth transistor having a gate electrically coupled to the second clock signal.

9. The shift register of claim 8, wherein the clock level shifter comprises:
    a fifth transistor, comprising a gate electrically coupled to the fourth transistor, and a first electrode electrically coupled to the first voltage supply end;
    a sixth transistor, comprising a gate electrically coupled to the input end, and a first electrode electrically coupled to the second voltage supply end; and
    an seventh transistor, comprising a gate electrically coupled to the output end, a first electrode electrically coupled to the second voltage supply end, and a second electrode electrically coupled to the level switching signal.

10. The shift register of claim 1, further comprising a first rest switch electrically coupled to the level shifting node, for resetting the shift register in response to a reset signal.

11. The shift register of claim 10, wherein the first reset switch is a second transistor comprising a gate electrically coupled to the reset signal, a first electrode electrically coupled to the level shifting node, and a second electrode electrically coupled to the second voltage supply end.

12. The shift register of claim 10, further comprising a second reset switch electrically coupled to input end, for resetting the shift register in response to the reset signal.

13. The shift register of claim 12, wherein the second reset switch is a third transistor comprising a gate electrically coupled to the reset signal, a first electrode electrically coupled to the second voltage supply end, and a second electrode electrically coupled to the input end.

* * * * *